(12) United States Patent
Hoshi et al.

(10) Patent No.: US 7,209,622 B2
(45) Date of Patent: Apr. 24, 2007

(54) RESONATOR AND LIGHT EMITTING DEVICE USING THE SAME

(75) Inventors: Hikaru Hoshi, Yokohama (JP); Akinari Takagi, Yokosuka (JP); Kiyokatsu Ikemoto, Yokohama (JP); Kazuya Nobayashi, Edogawa-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/446,783

(22) Filed: Jun. 5, 2006

(65) Prior Publication Data
US 2006/0275005 A1 Dec. 7, 2006

(30) Foreign Application Priority Data

Jun. 7, 2005 (JP) .............................. 2005-166753
May 24, 2006 (JP) .............................. 2006-144355

(51) Int. Cl.
*G02B 6/10* (2006.01)
*H01S 3/08* (2006.01)

(52) U.S. Cl. .......................... 385/129; 385/131; 372/92

(58) Field of Classification Search ..................... None
See application file for complete search history.

(56) References Cited

U.S. PATENT DOCUMENTS 5,784,400 A 7/1998 Joannopoulos et al.
7,085,467 B2 * 8/2006 Ikemoto et al. ............. 385/129

FOREIGN PATENT DOCUMENTS

EP 1647849 A1 * 4/2006
JP 2004-6567 1/2004
JP 2004004419 A * 1/2004

OTHER PUBLICATIONS

Ogawa, S.; Imada, M.; Yoshimoto, S.; Kako, S.; Furukawa, T.; Okano, M.; Noda, S., "Control of light emission by 3D photonic crystal," Lasers and Electro-Optics, 2004. (CLEO). Conference on , vol. 2, No. pp. 2 pp. vol. 2-, May 16-21, 2004.*

Chelnokov, A.; Rowson, S.; Lourtioz, J.-M.; Duvillaret, L.; Coutaz, J.-L., "Light controllable defect modes in three-dimensional photonic crystal," Electronics Letters , vol. 34, No. 20 pp. 1965-1967, Oct. 1, 1998.*

Noda, S.; Tomoda, K.; Yamamoto, N.; Imada, M.; Chutinan, A., "Three-dimensional photonic crystals based on III-V semiconductor at 1-2 μm wavelengths," Lasers and Electro-Optics Society 1999 12th Annual Meeting. LEOS '99. IEEE , vol. 2, No. pp. 493-494 vol. 2, 1999.*

Yablonovitch, "Inhibited Spontaneous Emission in Solid-State Physics and Electronics", Physical Review Letters, The American Physical Society, vol. 58, No. 20, May 18, 1987, pp. 2059-2062.

* cited by examiner

*Primary Examiner*—Rodney Bovernick
*Assistant Examiner*—Omar Rojas
(74) *Attorney, Agent, or Firm*—Morgan & Finnegan, L.L.P.

(57) ABSTRACT

Provided is a resonator using a three-dimensional photonic crystal. In the resonator, a range of choice of a resonance wavelength is wide and a desirable electric field distribution is obtained. The resonator according to the present invention includes a plurality of point defects provided in the three-dimensional photonic crystal. At least one of the plurality of point defects does not include a eigenmode in a photonic band gap of the three-dimensional photonic crystal.

11 Claims, 18 Drawing Sheets xz-SECTION xy-SECTION xz-SECTION 0.25a SHIFT xy-SECTION xz-SECTION xy-SECTION
(SECTION A)

xy-SECTION
(SECTION B)

SECTION A

SECTION A

SECTION B

SECTION A

SECTION A

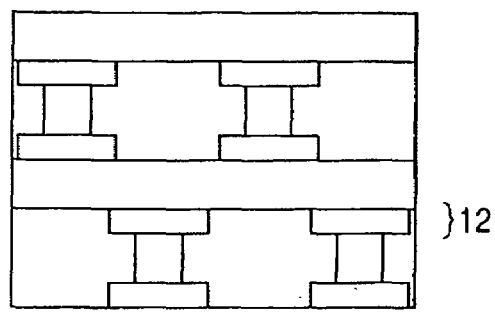
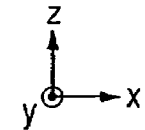
FIG. 11A
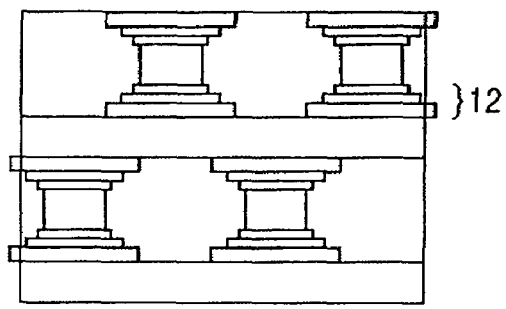
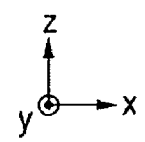
FIG. 11B
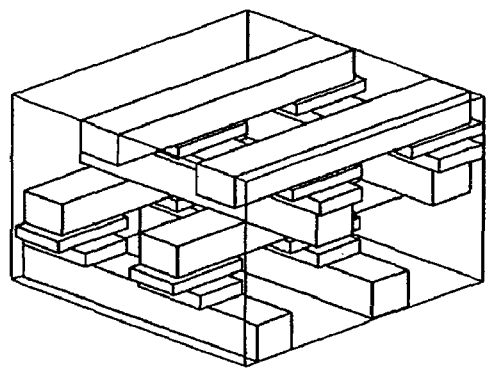
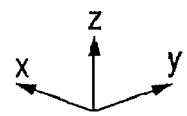
FIG. 11C
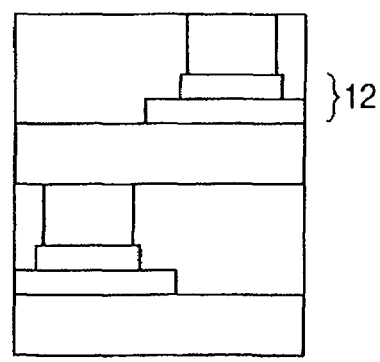
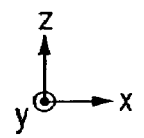
FIG. 11D xy-SECTION
(SECTION A)

xy-SECTION
(SECTION B)

DIAMOND-OPAL STRUCTURE

WOODPILE STRUCTURE

SPIRAL STRUCTURE

UNIQUE THREE-DIMENSIONAL STRUCTURE

INVERSE STRUCTURE

DIAMOND-WOODPILE STRUCTURE

US 7,209,622 B2

RESONATOR AND LIGHT EMITTING DEVICE USING THE SAME

BACKGROUND OF THE INVENTION

1. Field of the Invention

The present invention relates to a resonator and a light emitting device, and more particularly, to a high-performance resonator in which point defects are provided in a three-dimensional photonic crystal.

2. Related Background Art

The concept of controlling, for example, transmission and reflection characteristics of an electromagnetic wave by a structure having a size equal to or smaller than a wavelength thereof has been proposed by Yablonovitch (Physical Review Letters, Vol. 58, pp. 2059, 1987). When structures, each of which is equal to or smaller than the wavelength, are periodically arranged, for example, the transmission and reflection characteristics of the electromagnetic wave can be controlled. When the wavelength of the electromagnetic wave is reduced to a wavelength order of light, transmission and reflection characteristics of the light can be controlled by the structures. The construction of the structures is known as a photonic crystal. It is suggested that a reflecting mirror in which there is no light loss and thus reflectance thereof is 100% can be realized in a wavelength region when the structures are used. Therefore, it is said that the concept that the reflectance can be increased to 100% in the wavelength region corresponds to a photonic band gap in contrast with an energy band gap of a conventional semiconductor. A three-dimensional minute periodical structure can provide a photonic band gap for light incident from any direction. Hereinafter, this is referred to as a complete photonic band gap.

When the complete photonic band gap is used, an optical device having a novel function can be provided. For example, an optical device in which point or linear defects are provided in the photonic crystal can be operated as a resonator or a waveguide. According to U.S. Pat. No. 5,784,400, in particular, when a active medium including point defects is excited by an exciting means, a high-efficiency laser device in which light is confined to a very small region to suppress spontaneous emission can be realized. In addition, when a shape of the point defects is controlled, a light emitting pattern can be controlled with high precision.

FIGS. 18A, 18B, 18C, 18D, 18E and 18F show structures of a three-dimensional photonic crystal capable of realizing the complete photonic band gap.

In a resonator produced based on the complete photonic band gap (PBG) realized by the three-dimensional photonic crystal, there are generally a plurality of resonance modes. In a resonator used for the light emitting device or the like, it is necessary to have a desirable confining effect and satisfy a resonance condition at a desirable wavelength. It is necessary to increase an interval between a desirable resonance wavelength and the close resonance wavelength of the resonance mode so that the influence of a resonance mode with a close resonance wavelength, such as mode hopping caused in the case where the complete photonic band gap is applied to a laser resonator, can be avoided.

Japanese Patent Application Laid-Open No. 2004-006567, in which a resonator in which point defects are provided in an inner portion of a woodpile structure shown in FIG. 18B is described, discloses that the resonance wavelength can be controlled by controlling a shape or a position of the point defects having a thickness equal to that of a columnar structure. That is, a ratio between a length in x-axis direction and a length in y-axis direction of the point defect having a rectangular parallelepiped shape is changed or the position of the point defect is shifted in a longitudinal direction of a columnar structure including the point defect, thereby controlling the resonance wavelength and the like. However, when the position of the point defect is shifted, an electric field distribution in the inner portion of the resonator becomes asymmetrical because of the asymmetry of the structure. In particular, when such a resonator is applied to a light emitting device such as a laser, a large unbalance in orientation characteristic of emitted light occurs because of the asymmetry. A maximum shift amount of the point defect is half an arrangement period of columnar structures. Therefore, even when the length ratio of the point defect changes, a range of choice of the resonance wavelength is narrow, so a desirable resonance wavelength is not obtained in some cases. Thus, it is necessary that the resonator using the three-dimensional photonic crystal have a desirable electric field intensity distribution at the desirable resonance wavelength.

SUMMARY OF THE INVENTION

According to an aspect of the present invention, a resonator is characterized by including: a plurality of point defects provided in a three-dimensional photonic crystal, and in the resonator, the three-dimensional photonic crystal includes: a first layer in which a plurality of columnar structures are arranged at a predetermined interval therebetween; a second layer in which a plurality of columnar structures extended in a direction different from an extension direction of the columnar structure of the first layer are arranged at predetermined intervals; a third layer in which a plurality of columnar structures extended in a direction aligned with the extension direction of the columnar structure of the first layer are arranged at predetermined intervals; a fourth layer in which a plurality of columnar structures extended in a direction aligned with an extension direction of the columnar structure of the second layer are arranged at predetermined intervals; and at least one additional layer including discrete structures discretely arranged on a plane parallel to each of the first layer, the second layer, the third layer, and the fourth layer. Further, in the resonator, the first layer, the second layer, the third layer, and the forth layer are successively stacked with the additional layer interposed therebetween. Further, in the resonator, the columnar structures included in the first layer and the third layer are stacked so that the columnar structures is shifted by half the predetermined interval in a direction perpendicular to the direction in which the columnar structures are extended. Further, in the resonator, the columnar structures included in the second layer and the fourth layer are stacked so that the columnar structures is shifted by half the predetermined interval in a direction perpendicular to the direction in which the columnar structures are extended. Further, in the resonator, each of the discrete structures included in the additional layer is a three-dimensional photonic crystal located in a position corresponding to each of intersections of the columnar structures. Further, the plurality of point defects include at least one point defect which has no specific resonance mode in a photonic band gap of the three-dimensional photonic crystal.

BRIEF DESCRIPTION OF THE DRAWINGS

FIGS. 11A, 11B, 11C, and 11D are schematic views showing a three-dimensional photonic crystal structure;

DETAILED DESCRIPTION OF THE PREFERRED EMBODIMENTS (First Embodiment)

Figure 6A:
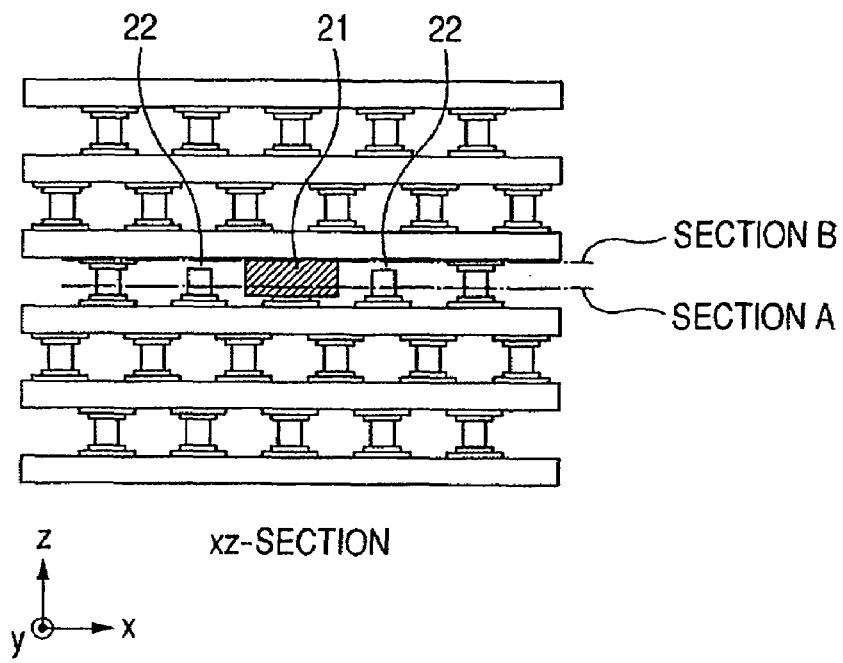
FIGS. 6A, 6B, and 6C are schematic views showing a resonator structure D.
Figure 6B:
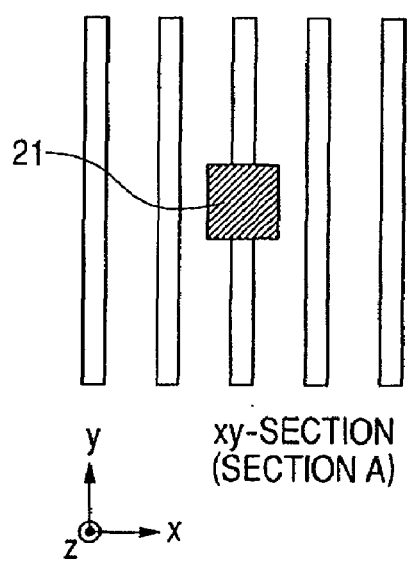
Figure 6C:
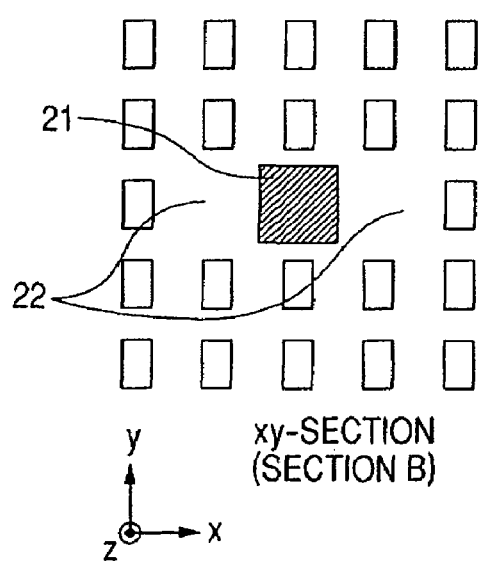

FIGS. 6A, 6B and 6C show a resonator structure D including three point defects, which is used for a resonator. The resonator structure includes two point defects each of which has no eigenmode. The resonator structure D in a first embodiment will be described below while comparing with a resonator structure B and a resonator structure C, each of which is composed of a point defect.

Figure 1:
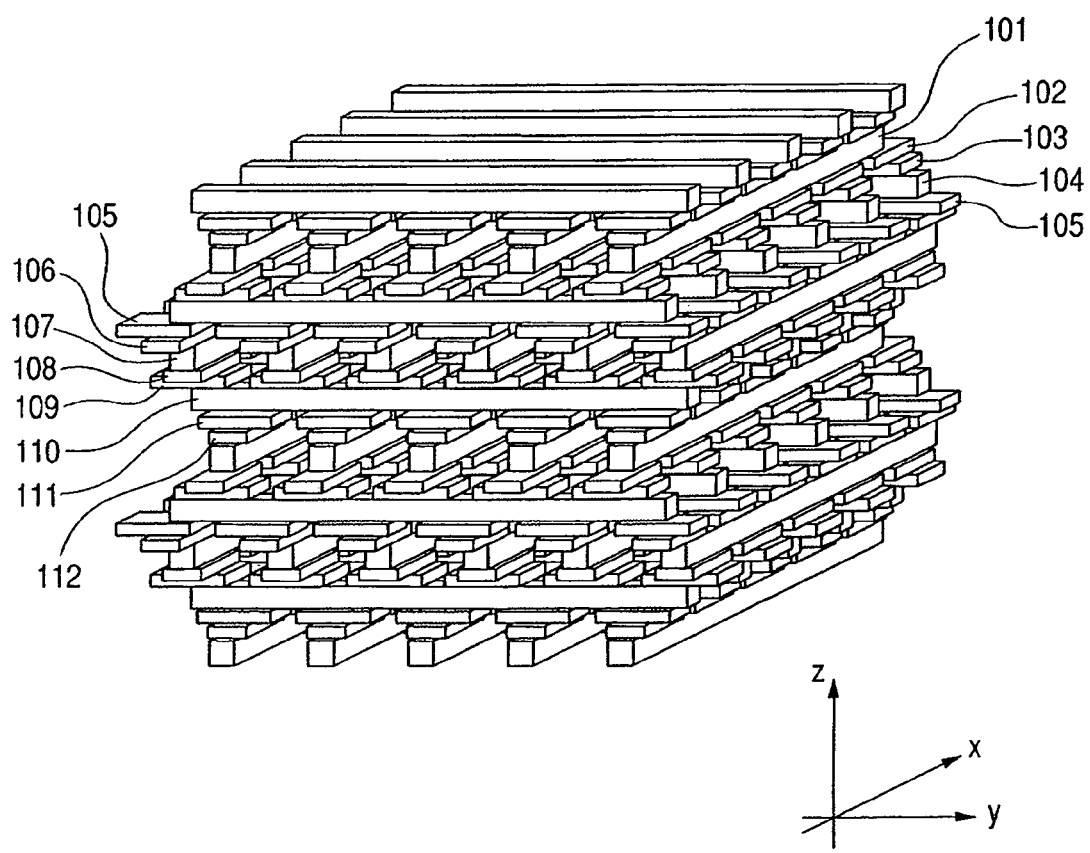
FIG. 1 is a schematic view showing a three-dimensional photonic crystal structure A.
Figure 2:
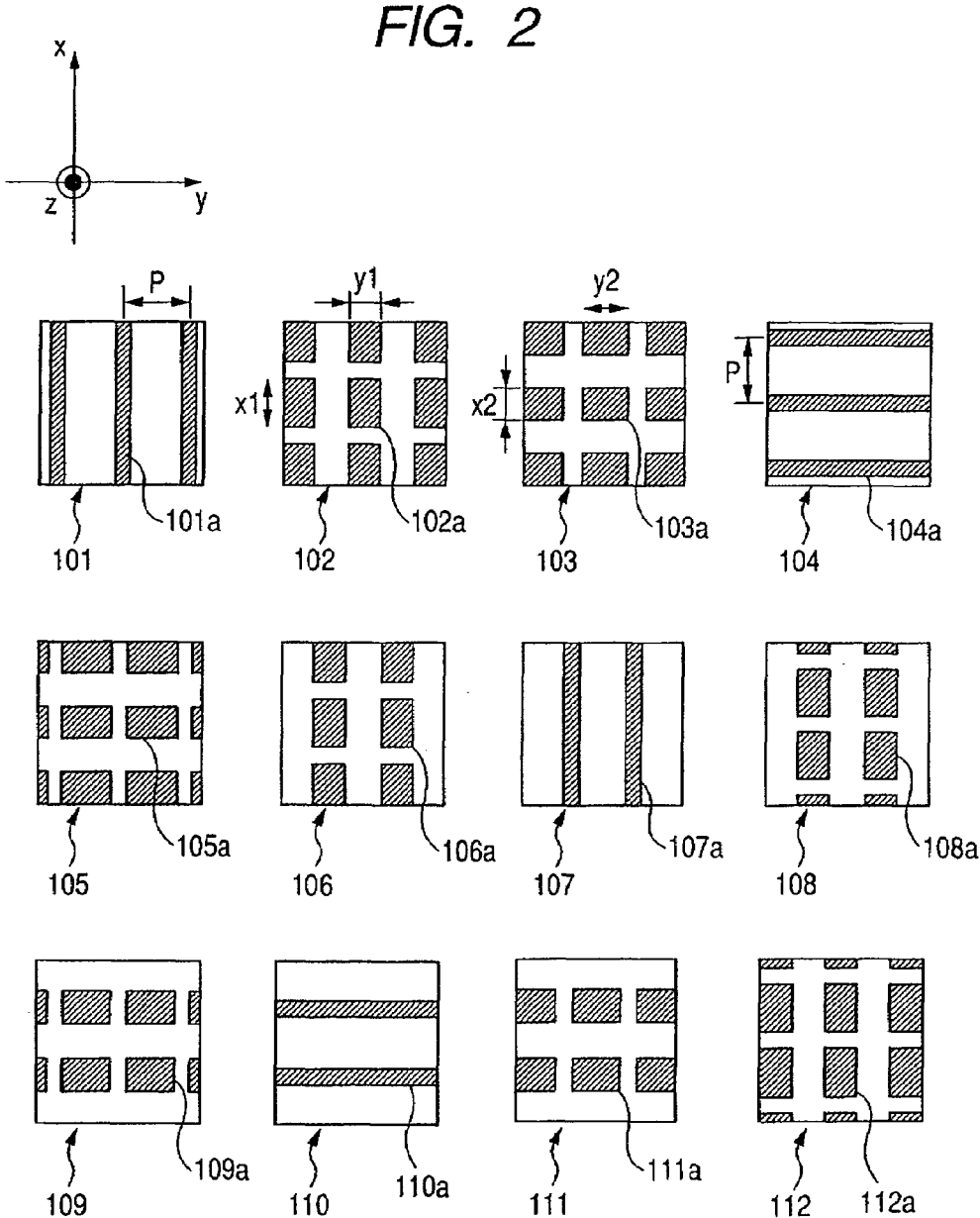
FIG. 2 is a schematic view showing an xy-section of the three-dimensional photonic crystal structure A.

FIG. 1 is a schematic view showing a three-dimensional photonic crystal structure A having a photonic band gap wider than that of a three-dimensional photonic crystal including, for example, a conventional woodpile structure. The three-dimensional photonic crystal structure "A" includes twelve layers 101 to 112, each of which has an xy-plane, which are provided as a fundamental periodical group. FIG. 2 shows a part of an xy-section of the respective of the layers. The first (seventh) layer 101 (107) includes a plurality of columnar structures 101a (107a) which extend in an x-axis direction and are arranged in a y-direction at regular intervals P. The columnar structures 101a and 107a are arranged in a y-axis direction in positions shifted from each other by P/2. The fourth (tenth) layer 104 (110) includes a plurality of columnar structures 104a (110a) which extend in the y-axis direction and are arranged in an x-direction at the regular intervals P. The columnar structures 104a and 110a are arranged in an x-axis direction in positions shifted from each other by P/2. The second (third) layer 102 (103) includes a discrete structure 102a (103a) having portions arranged in positions corresponding to intersections between the columnar structures 101a of the first layer 101 and the columnar structures 104a of the fourth layer 104 so as to be in contact with one another within the xy-plane. There is the symmetry between the discrete structure 102a and the discrete structure 103a. That is, the discrete structure 102a and the discrete structure 103a can be completely overlapped with each other by rotation of 90 degrees in the xy-plane. The fifth (sixth; eighth; ninth; eleventh; or twelfth) layer 105 (106; 108; 109; 111; or 112) located between the layers including the columnar structures includes a discrete structure 105a (106a; 108a; 109a; 111a; or 112a) having portions arranged in positions corresponding to intersections between the columnar structures of adjacent layers. The columnar structure and the discrete structure in the respective layers are in contact with each other. A refractive index, a shape of each columnar structure, a shape of each discrete structure, an interval between structures, a thickness of each layer, and the like are optimized, so that it is possible to obtain a wide complete photonic band gap in a desirable frequency band range (wavelength band range).

Hereinafter, the columnar structure is referred to as a rod and an in-plane lattice period is referred to as the interval P of the rod as shown in FIG. 2. An out-of-plane lattice period is referred to as a fundamental period of a plurality of layers. For example, in the case of the three-dimensional photonic crystal structure A, the out-of-plane lattice period corresponds to a height of the twelve layers 101 to 112.

Table 1 shows the details of the three-dimensional photonic crystal structure A. A refractive index in this table indicates a refractive index of a medium which is a part of a layer including the columnar structures or the discrete structure in the three-dimensional photonic crystal structure. A medium other than the medium which is the part of the layer including the columnar structures or the discrete structure in the three-dimensional photonic crystal structure is air and a refractive index thereof is 1.0. In the following embodiments, the same is expected.

TABLE 1

Structure A
Photonic Crystal Structure

| | |
|---|---|
| Refractive Index | 2.4 |
| In-plane Lattice Period | P |
| Out-of-plane Lattice Period | 1.4P |
| Rod Width | 0.30P |
| Rod Height | 0.25P |
| Discrete Structure Width Ax1 | 0.60P |
| Discrete Structure Width Ay1 | 0.40P |
| Discrete Structure Height Az1 | 0.05P |
| Discrete Structure Width Ax2 | 0.40P |
| Discrete Structure Width Ay2 | 0.60P |
| Discrete Structure Height Az2 | 0.05P |

Figure 3:
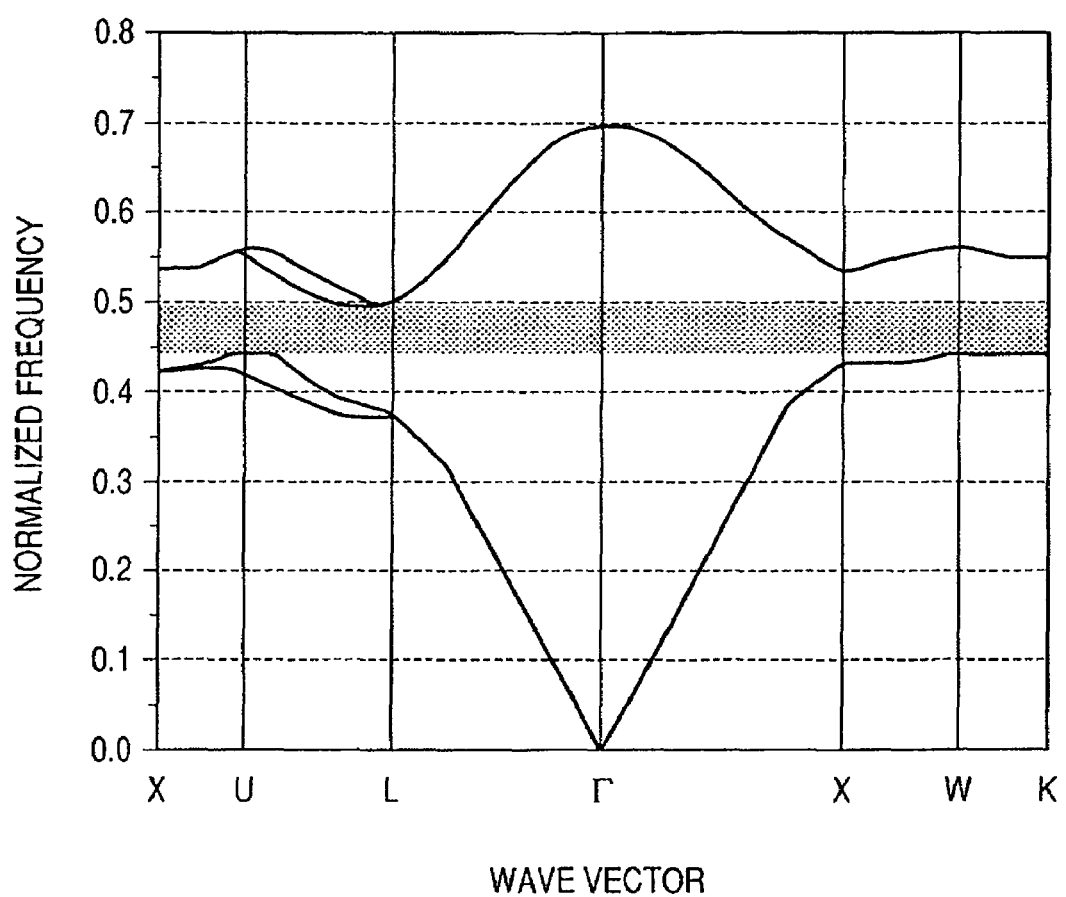
FIG. 3 is an explanatory graph showing a photonic band gap of the three-dimensional photonic crystal structure A.

FIG. 3 is a graph showing a result obtained by calculating a photonic band gap of the three-dimensional photonic crystal structure A using a plane wave expansion method. The abscissa of the graph indicates a wave vector, that is, an incident direction of an electromagnetic wave incident on a photonic crystal. For example, the point K indicates a wave vector parallel with an x-axis (or y-axis) and the point X indicates a wave vector having a tilt of 45° with respect to the x-axis (or y-axis) within the xy-plane. The ordinate of the graph indicates a frequency normalized by a lattice period (normalized frequency). In a frequency band range indicated by hatching in FIG. 3, the complete photonic band gap in which light cannot be present is formed regardless of an incident direction of light. When a point defect is provided in the three-dimensional photonic crystal, a defect mode is generated in the photonic band gap. Only light having a frequency (wavelength) corresponding to the defect mode can be present in the photonic band gap, so a resonator having high wavelength selectivity is realized.

Figure 4A:
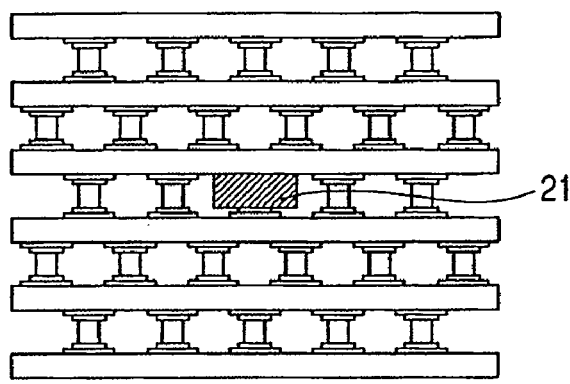
FIGS. 4A and 4B are schematic views showing a resonator structure B.
Figure 4B:
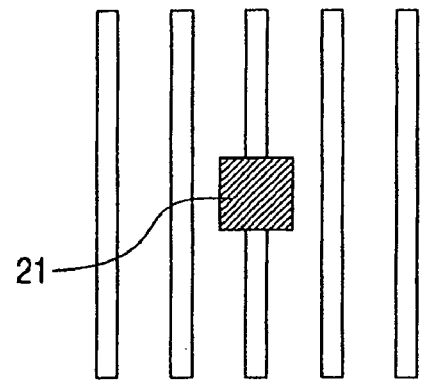
Figure 5A:
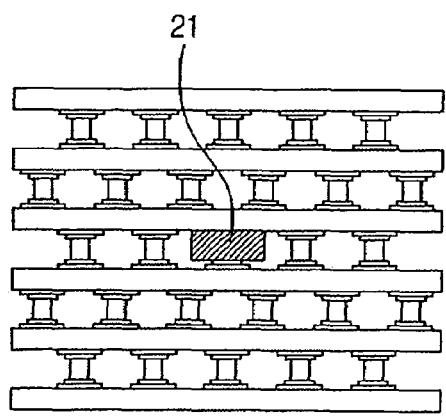
FIGS. 5A and 5B are schematic views showing a resonator structure C.
Figure 5B:
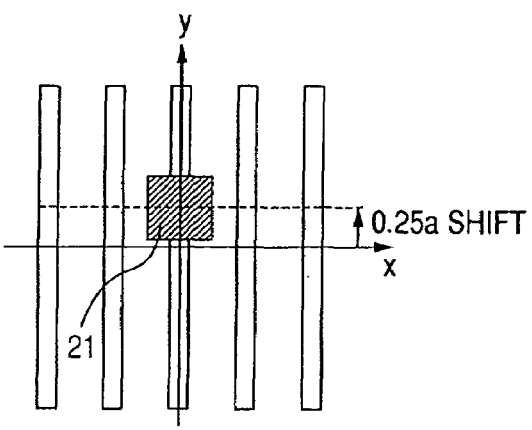

Next, a structure in which a point defect is provided in an inner portion of the three-dimensional photonic crystal structure A will be described. As shown in FIGS. 4A and 4B, the resonator structure B is a resonator structure in which a point defect is included in the three-dimensional photonic crystal structure A. As shown in FIGS. 5A and 5B, the resonator structure C is a structure in which a position of the point defect of the resonator structure B is shifted in a longitudinal direction of a rod including the point defect by 0.25P. As shown in FIGS. 6A, 6B and 6C, the resonator structure D in the first embodiment of the present invention is a resonator structure in which the three point defects are included in the three-dimensional photonic crystal structure A. Two of the point defects have no eigenmode. The structures B, C, and D are shown in detail in Tables 2, 3, and 4, respectively.

TABLE 2

Structure B

| Photonic Crystal Structure | |
|---|---|
| Refractive Index | 2.4 |
| In-plane Lattice Period | P |
| Out-of-plane Lattice Period | 1.4P |
| Rod Width | 0.30P |
| Rod Height | 0.25P |
| Discrete Structure Width Bx1 | 0.60P |
| Discrete Structure Width By1 | 0.40P |
| Discrete Structure Height Bz1 | 0.05P |
| Discrete Structure Width Bx2 | 0.40P |
| Discrete Structure Width By2 | 0.60P |
| Discrete Structure Height Bz2 | 0.05P |
| Point Defect Structure | |
| Center Coordinates (x, y, z) | (0.00P, 0.00P, 0.00P) |
| Refractive Index | 2.4 |
| Defect Structure Width B'x1 | 1.00P |
| Defect Structure Width B'y1 | 1.00P |
| Defect Structure Width B'z1 | 0.35P |

TABLE 3

Structure C

| Photonic Crystal Structure | |
|---|---|
| Refractive Index | 2.4 |
| In-plane Lattice Period | P |
| Out-of-plane Lattice Period | 1.4P |
| Rod Width | 0.30P |
| Rod Height | 0.25P |
| Discrete Structure Width Cx1 | 0.60P |
| Discrete Structure Width Cy1 | 0.40P |
| Discrete Structure Height Cz1 | 0.05P |
| Discrete Structure Width Cx2 | 0.40P |
| Discrete Structure Width Cy2 | 0.60P |
| Discrete Structure Height Cz2 | 0.05P |
| Point Defect Structure | |
| Center Coordinates (x, y, z) | (0.00P, 0.25P, 0.00P) |
| Refractive Index | 2.4 |
| Defect Structure Width C'x1 | 1.00P |

TABLE 3-continued

Structure C

| Defect Structure Width C'y1 | 1.00P |
|---|---|
| Defect Structure Width C'z1 | 0.35P |

TABLE 4

Structure D

| Photonic Crystal Structure | |
|---|---|
| Refractive Index | 2.4 |
| In-plane Lattice Period | P |
| Out-of-plane Lattice Period | 1.4P |
| Rod Width | 0.30P |
| Rod Height | 0.25P |
| Discrete Structure Width Dx1 | 0.60P |
| Discrete Structure Width Dy1 | 0.40P |
| Discrete Structure Height Dz1 | 0.05P |
| Discrete Structure Width Dx2 | 0.40P |
| Discrete Structure Width Dy2 | 0.60P |
| Discrete Structure Height Dz2 | 0.05P |
| Point Defect Structure | |
| Defect Structure D'1 | |
| Center Coordinates (x, y, z) | (0.00P, 0.00P, 0.00P) |
| Refractive Index | 2.4 |
| Defect Structure Width D'x1 | 1.00P |
| Defect Structure Width D'y1 | 1.00P |
| Defect Structure Width D'z1 | 0.35P |
| Defect Structure D'2 | |
| Center Coordinates (x, y, z) | (−1.00P, 0.00P, 0.175P) |
| Refractive Index | 1 |
| Defect Structure Width D'x2 | 0.60P |
| Defect Structure Width D'y2 | 0.60P |
| Defect Structure Width D'z2 | 0.10P |
| Defect Structure D'3 | |
| Center Coordinates (x, y, z) | (1.00P, 0.00P, 0.175P) |
| Refractive Index | 1.0 (Air) |
| Defect Structure Width D'x3 | 0.60P |
| Defect Structure Width D'y3 | 0.60P |
| Defect Structure Width D'z3 | 0.10P |

Table 5 shows normalized frequencies P/λ (P is lattice period and λ is wavelength) of resonance modes which are calculated using a finite-difference time-domain (FDTD) method in the case of each of the resonator structures B, C, and D. The resonance modes can be classified by differences among peak positions in an electric field distribution. A resonance mode 1, a resonance mode 2, and a resonance mode 3 are specified based on an electric field distribution near each point defect.

In this embodiment, a resonance wavelength in the resonance mode 2 is selectively controlled. This reason is as follows. When there are a plurality of strong peaks in a resonance mode, an orientation characteristic of light emitted to the outside of a resonator deteriorates. In contrast to this, an electric field distribution of the resonance mode 2 in this embodiment does not include a plurality of strong peaks in comparison with the other resonance modes. In particular, when a resonator is applied to a light emitting device such as a laser, the orientation characteristic of the emitted light is important as described above.

TABLE 5

|  | Resonance Mode 1 | Resonance Mode 2 | Resonance Mode 3 |
|---|---|---|---|
| Structure B | 0.459548 | 0.478696 | — |
| Structure C | 0.459548 | 0.483318 | 0.49191 |
| Structure D | 0.460868 | 0.485298 | — |

Band Range of Photonic Band Gap is 0.452 to 0.497

Figure 4C:
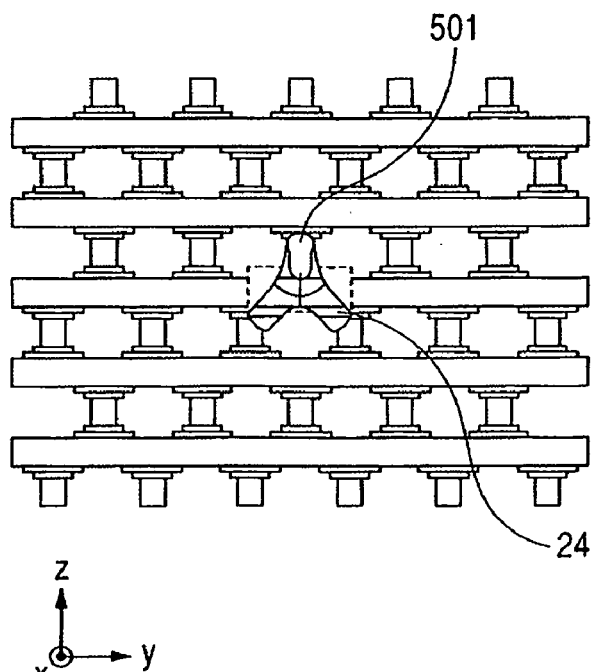
FIG. 4C shows an electric field distribution therein.
Figure 5C:
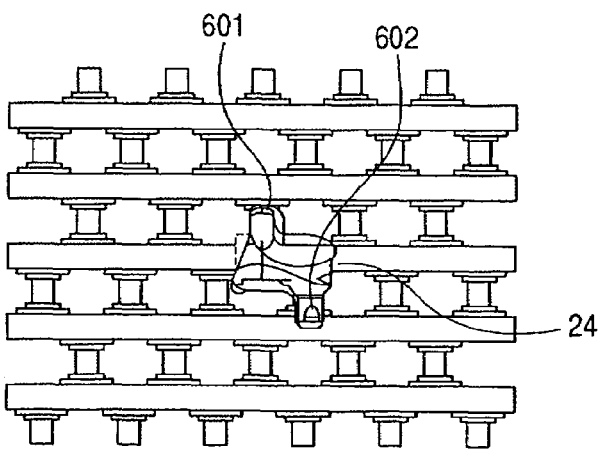
FIG. 5C shows an electric field distribution therein.

When an electric field distribution caused in the resonance mode 2 in the structure B shown in FIG. 4C is compared with an electric field distribution caused in the resonance mode 2 in the structure C shown in FIG. 5C, there is a difference between the electric field distributions, in particular, in a yz-section. In the structure B, electric field concentrates on an inner portion of a rod 501 adjacent to a point defect. However, in the structure C, the point defect is shifted in the y-axis direction, so electric field concentrates on two regions of inner portions of rods 601 and 602 adjacent to a point defect. Therefore, it is apparent that the electric field distribution significantly changes with a change in position of the point defect. When electric field distribution of an inner portion of the point defect includes a plurality of peaks as in the case of the structure C, the unbalance of the orientation characteristic of the emitted light becomes very significant.

On the other hand, in the structure C, the novel resonance mode 3 is caused in a band range of the photonic band gap. A refractive index distribution of the resonator and the electric field distribution thereof are changed by the shift of the position of the point defect. As a result, in the case of the resonance mode 2, an effective refractive index of the resonator decreases and thus the resonance wavelength is shifted to a short wavelength side. However, in the case of the resonance mode 3, the effective refractive index of the resonator increases and thus the resonance wavelength is shifted to a long wavelength side. A difference between the behaviors of the resonance wavelengths is caused by a difference between the electric field distributions of the respective resonance modes. A wavelength interval between the resonance mode 2 and the resonance mode 3 narrows, with the result that a wavelength interval between resonance modes shortens. Therefore, when only the resonance wavelength in the resonance mode 2 is to be selectively controlled, it is not preferable to shift the position of the point defect.

As described above, the structure C has to be improved in the unbalance of the orientation characteristic due to the distortion of the electric field distribution near the point defect, the deterioration of mode separation between resonance modes, a reduction in range of choice of the resonance wavelength, and the like.

Figure 7A:
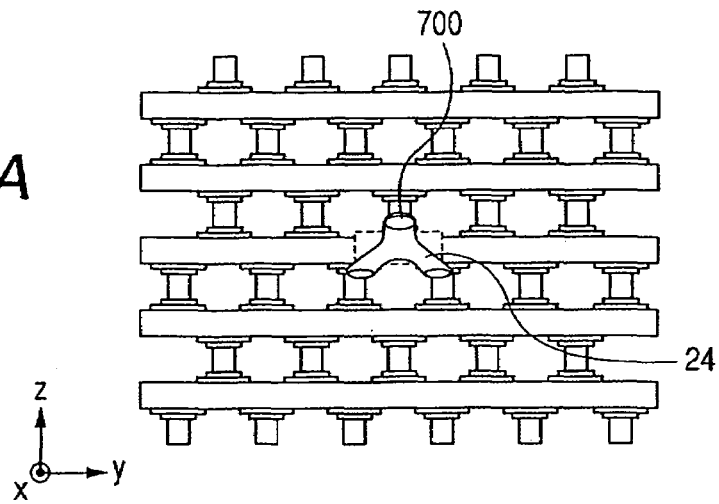
FIGS. 7A, 7B, and 7C show electric field distributions in the resonator structure D.

In contrast to this, the structure D according to the first embodiment of the present invention is a resonator structure in which the three point defects are included in the inner portion of the three-dimensional photonic crystal structure. Two of the point defects have no eigenmode. FIG. 7A shows an electric field distribution of the resonance mode 2 in the yz-section. The electric field concentrates on an inner portion of a rod 700. The distortion of the electric field distribution resulting from the provided three point defects does not appear. When a point defect 701 is provided, light having a specific resonance wavelength can be concentrated on the vicinity of the point defect. In addition, when point defects 702 and 703, each of which has no eigenmode, are provided, the resonance wavelength in the resonance mode 2 can be controlled. Locations of the point defects 702 and 703, each of which has no eigenmode, do not produce a novel resonance mode, so that the deterioration of separation between the resonance modes, such as a reduction in resonance wavelength interval, does not occur.

When the three-dimensional photonic crystal A includes a very small spherical defect whose refractive index is 2.4 and radius is 0.33 P, there is no eigenmode. Therefore, even in the case of a point defect of the resonator structure D in this embodiment, when a volume of the point defect which is calculated based on a refractive index is equal to or smaller than a volume of the spherical defect $(4/3\ \pi(0.33\ P/2.4)^3 = 0.010889\ P^3)$, there is no eigenmode.

Figure 7B:
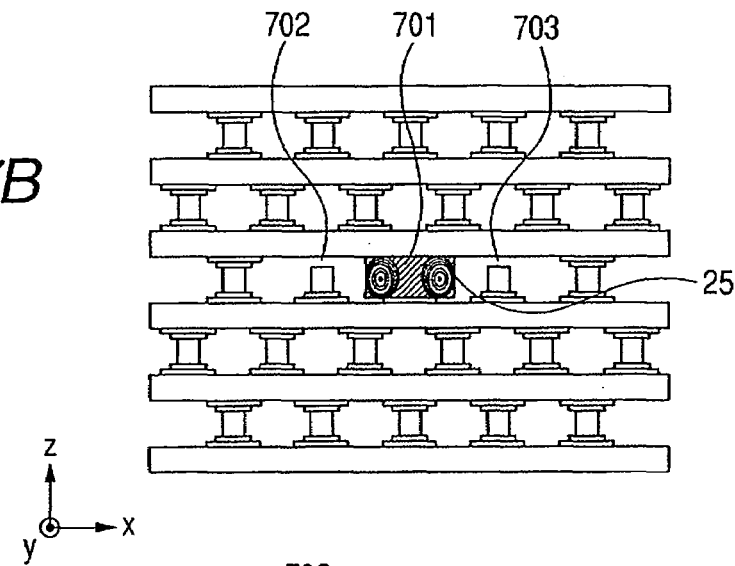
Figure 7C:
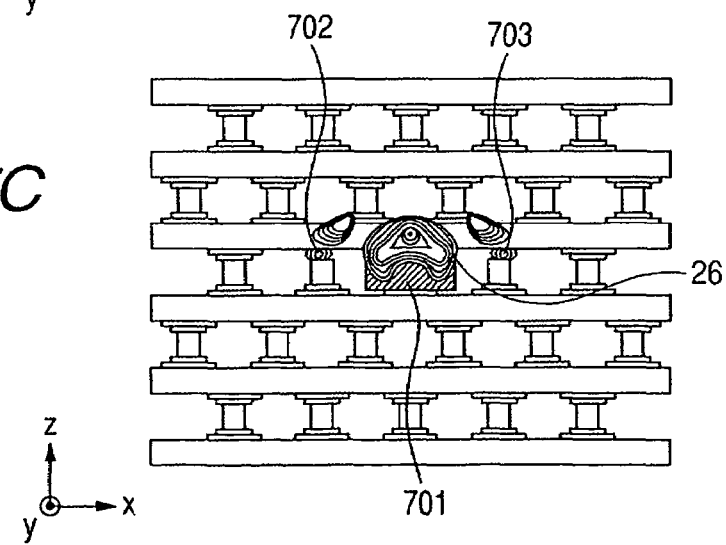

FIGS. 7B and 7C show electric field distributions (xz-section) in respective resonance modes of the resonator structure D. In the resonance mode 1 shown in FIG. 7B, electric field concentrates mainly on an inner portion of the point defect 701. In contrast to this, in the resonance mode 2 shown in FIG. 7C, it is apparent that there are electric field not only in the inner portion of the point defect 701 but also in rods near the point defect 701 and discrete structure portions, thereby generating a relatively expanded electric field distribution. In particular, when attention is focused on the regions of the point defects 702 and 703, the electric field of the resonance mode 1 is weak but the electric field of the resonance mode 2 concentrates on the regions thereof. Therefore, in this embodiment, a refractive index distribution of the point defects 702 and 703 is modulated to selectively control the effective refractive index in the resonance mode 2.

When a refractive index of a medium constituting the defect portion of the point defects 702 and 703 or each defect size is increased, the effective refractive index can be increased. In contrast to this, it is particularly effective to use air as the medium constituting the point defect to decrease the effective refractive index. A refractive index difference between the medium constituting the point defect of the point defect and a medium constituting a rod or a discrete structure of the photonic crystal can be increased, so the effective refractive index can be controlled within a wider range. Further, the point defect can be obtained only by the control of patterning during a semiconductor process, so the photonic crystal is easily produced as compared with the case where the point defect includes media having different refractive indices.

The electric field distribution in the resonance mode includes a plurality of peaks including a first peak strength, a second peak strength, and a third peak strength in portions apart from the portion on which the electric field most concentrates in addition to a portion on which the electric field most concentrates. The effective refractive index can be effectively controlled by arranging defect portions having a size, at which no inherent resonance mode exists, in regions in which the peaks of the electric field are included. In order to effectively control the effective refractive index, it is desirable that an electric field in a position in which the point defect is located be equal to or larger than one ten-thousandth of that in the portion on which the electric field most concentrates. In the case where the electric field becomes smaller than this value, even when the point defect is located, a sufficient change in effective refractive index is not obtained. In this embodiment, it is desirable to locate a defect portion in each of regions (area within approximately four times the in-plane lattice period P from the point defect having the specific resonance mode) having a plurality of peak strengths including up to a fourth peak strength within the xy-plane. In the case of the plane including the z-axis, it is desirable to locate the defect portion in each of the regions (area within approximately 2.5 times the in-plane lattice period from the point defect having the specific resonance mode) having the plurality of peak strengths including up to the fourth peak strength.

As described above, by controlling the structure of the portion on which the electric field concentrates, it is possible to selectively control the resonance wavelength of the resonance mode 2. In particular, the control is effective in the case where the spread of the electric field distribution with the specific resonance mode is large, such as the case where the refractive index of a medium constituting of the three dimensional photonic crystal is low.

With the range of choice of the resonance wavelength, the normalized frequency of the resonance mode 2 in the structure D is shifted by 0.006602 as compared with the case of the structure B. On the other hand, a shift amount of the normalized frequency in the structure C is 0.004622. This corresponds to the following. That is, supposing that the center wavelength of a photonic band gap is 527 nm (in-plane lattice period P=250 nm), the shift amount of the resonance wavelength in the structure D according to this embodiment is 7.1 nm in comparison that the shift amount of the resonance wavelength in the structure C is 5.0 nm. Therefore, the shift amount of the normalized frequency in the structure D is approximately 1.42 times that in the structure C. As described above, according to the resonator structure in this embodiment, the range of choice of the resonance wavelength can be widened. Thus, a high-performance resonator operated at a desirable resonance wavelength is obtained.

As in the case of the conventional structure, it is desirable to use two or more kinds of media having a high refractive index ratio as media constituting the resonator structure using the three-dimensional photonic crystal. A medium constituting the rod and the discrete structure is desirably material having a high-refractive index such as Si, GaAs, InP, Ge, $TiO_2$, GaN, $Ta_2O_5$, or $Nb_2O_5$. This medium is more preferably a material which does not cause absorption in a use wavelength band range and is transparent. A dielectric such as $SiO_2$, a polymer organic material such as PMMA, or a low-refractive index medium such as air or water is used as a medium other than the medium constituting the rod and the discrete structure. The photonic band gap is obtained owing to the refractive index distribution of the crystal. Therefore, when media having a higher refractive index ratio therebetween are combined with each other, a wider photonic band gap can be obtained. In order to obtain a photonic band gap having an effective width, it is desirable that the refractive index ratio be equal to or larger than two. In view of a process for producing the three-dimensional photonic crystal, it is desirable to adopt a solid medium as the medium other than the medium constituting the rod and the discrete structure, because it is easy to improve the strength of three-dimensional structure and to form a desirable shape in steps such as mask pattering, etching, polishing, wafer fusing on the rods and the discrete structures during the producing process. A conventional producing method (such as a method of repeating structural patterning using electron beam lithography and lamination, a wafer fusion technique, or a nanoimprint technique) can be used.

In this embodiment, the three-dimensional photonic crystal having the two layers including the discrete structures is described. The number of layers including the discrete structures is not limited to two. As shown in FIGS. 11A, 11B, 11C and 11D, even when a three-dimensional photonic crystal structure having one or three layers including the discrete structures or a three-dimensional photonic crystal structure having the discrete structure provided in one side of a rod is used, the same effect can be obtained.

According to the resonator structure in this embodiment, the desirable resonance wavelength can be selected owing to the widened range of choice of resonance wavelength by providing the point defect having no eigenmode. The interval between the desirable resonance wavelength and a resonance wavelength of the resonance mode adjacent to the desirable resonance wavelength can be widened. Further, the orientation characteristic of the emitted light can be improved without distorting the electric field distribution.

(Second Embodiment)

In this embodiment, a resonator structure (structure E) in which a size of the point defect having no eigenmode is adjusted will be described.

Figure 8A:
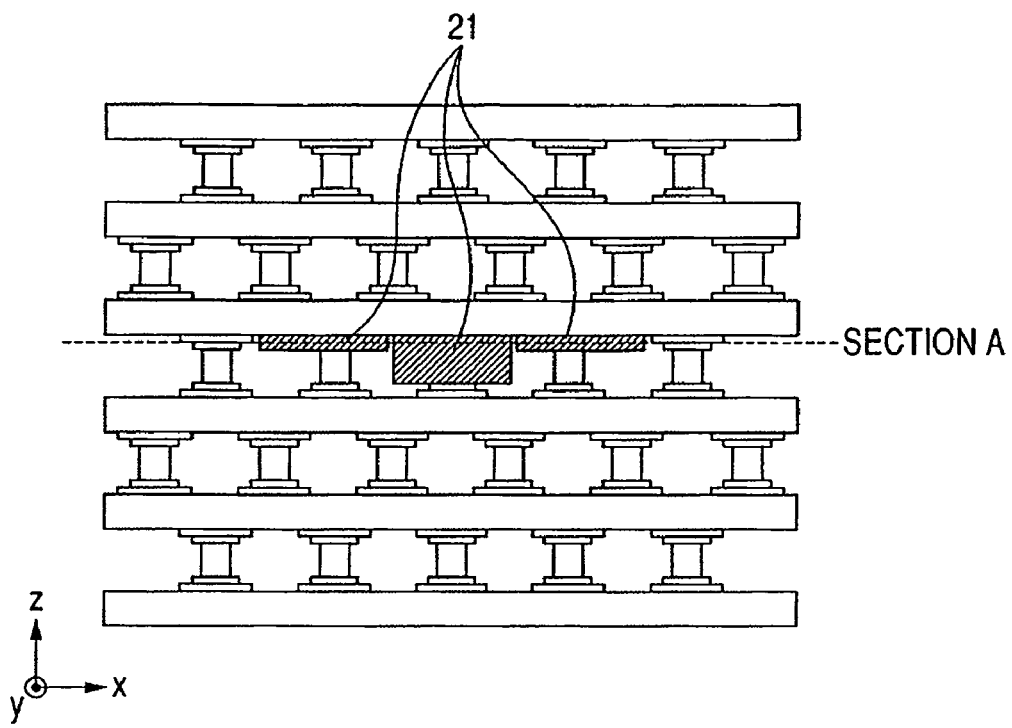
FIGS. 8A and 8B are schematic views showing a resonator structure E.
Figure 8B:
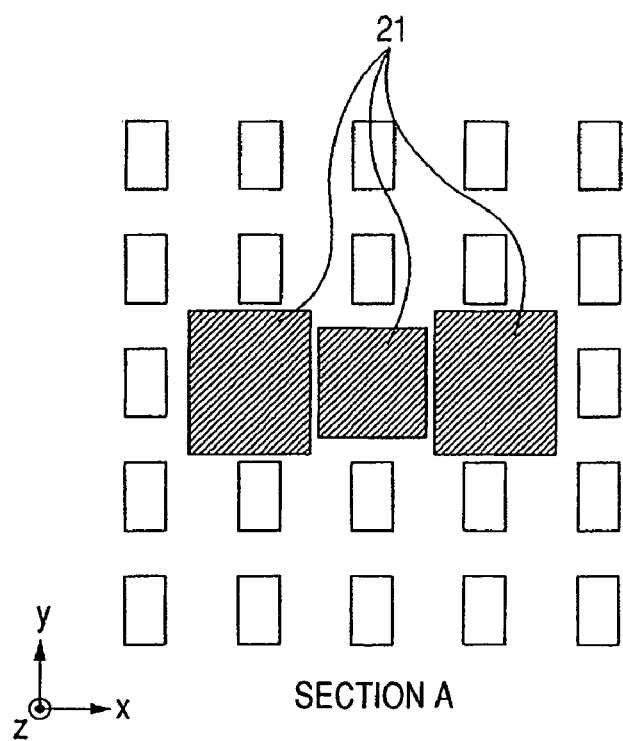

FIGS. 8A and 8B are schematic views showing the structure E. The structure E includes a defect structure E'1 and defect structures E'2 and E'3. Each of the defect structures E'2 and E'3 has no eigenmode. Table 6 shows the specific details of the structure E. Table 7 shows normalized frequencies of the resonance modes in the structure E.

TABLE 6

Structure E

| Photonic Crystal Structure | |
|---|---|
| Refractive Index | 2.4 |
| In-plane Lattice Period | P |
| Out-of-plane Lattice Period | 1.4P |
| Rod Width | 0.30P |
| Rod Height | 0.25P |
| Discrete Structure Width Ex1 | 0.60P |
| Discrete Structure Width Ey1 | 0.40P |
| Discrete Structure Height Ez1 | 0.05P |
| Discrete Structure Width Ex2 | 0.40P |
| Discrete Structure Width Ey2 | 0.60P |
| Discrete Structure Height Ez2 | 0.05P |
| Point Defect Structure | |
| Defect Structure E'1 | |
| Center Coordinates (x, y, z) | (0.00P, 0.00P, 0.00P) |
| Refractive Index | 2.4 |
| Defect Structure Width E'x1 | 1.00P |
| Defect Structure Width E'y1 | 1.00P |
| Defect Structure Width E'z1 | 0.35P |
| Defect Structure E'2 | |
| Center Coordinates (x, y, z) | (−1.10P, 0.00P, 0.175P) |
| Refractive Index | 2.4 |
| Defect Structure Width E'x2 | 1.10P |
| Defect Structure Width E'y2 | 1.30P |
| Defect Structure Width E'z2 | 0.10P |
| Defect Structure E'3 | |
| Center Coordinates (x, y, z) | (1.10P, 0.00P, 0.175P) |
| Refractive Index | 2.4 |
| Defect Structure Width E'x3 | 1.10P |
| Defect Structure Width E'y3 | 1.30P |
| Defect Structure Width E'z3 | 0.10P |

TABLE 7

| | Resonance Mode 1 | Resonance Mode 2 | Resonance Mode 3 |
|---|---|---|---|
| Structure E | 0.456246 | 0.474074 | 0.495202 |

The defect structures E'2 and E'3 larger than the discrete structure included in the periodical structure are provided so as to increase the effective refractive index in the vicinity of the resonator, thereby shifting the resonating frequency thereof to the low-frequency side (to shift the resonance wavelength to the long-wavelength side). The positions at which the defect structures E'2 and E'3 are located correspond to regions at which the electric field distribution of the resonance mode 2 shows strong intensities. Therefore, the resonance wavelength can be selectively adjusted particularly for the resonance mode 2. When the position of the point defect is shifted as in the case of the structure C, the resonance wavelength can be shifted only toward the short-wavelength side. This is because, when the position of the point defect is shifted to change the refractive index distribution of the resonator and the electric field distribution thereof, the effective refractive index of the resonator reduces, thereby shifting the resonance wavelength toward the short-wavelength side. On the other hand, according to this embodiment, the resonance wavelength can be controlled toward the long-wavelength side, so the range of choice of the resonance wavelength can be widened. In this embodiment, when the center wavelength of the photonic band gap is set to 527 nm (in-plane lattice period P=250 nm), the resonance wavelength of the resonance mode 2 in the structure B is shifted toward the long-wavelength side by 5.1 nm. Thus, when the size of the point defect is adjusted, the resonance wavelength can be controlled.

(Third Embodiment)

In this embodiment, a resonator structure (structure F) in which the number of point defects is changed or an arrangement of the point defects is changed will be described.

Figure 9A:
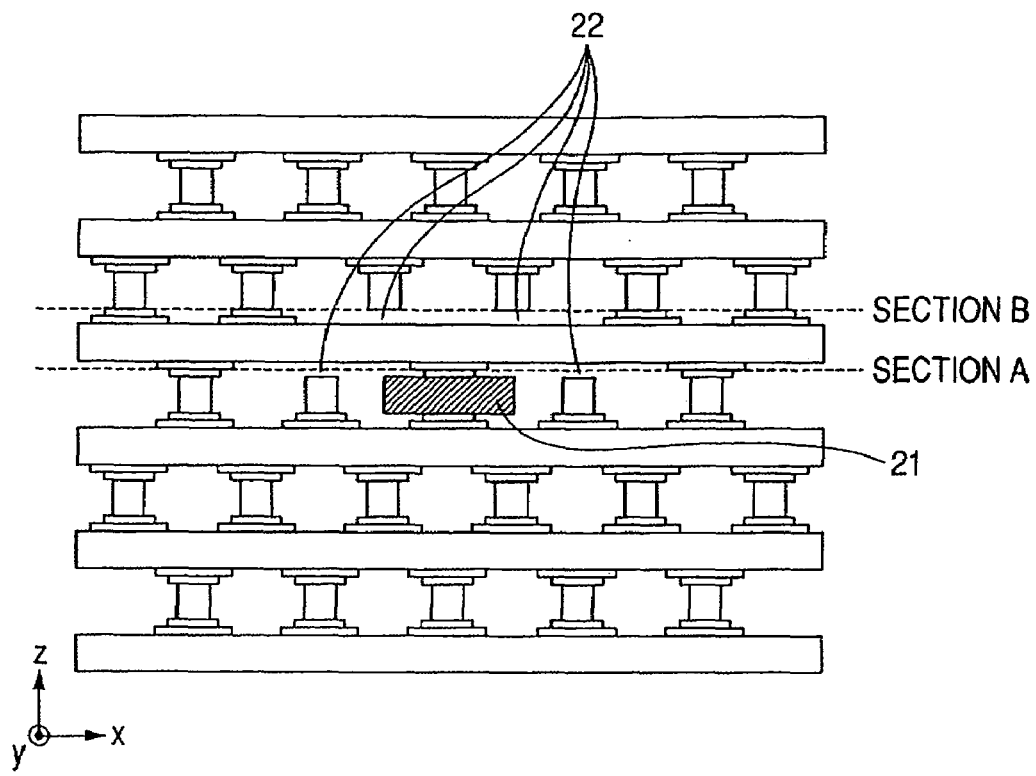
FIGS. 9A, 9B, and 9C are schematic views showing a resonator structure F.
Figure 9B:
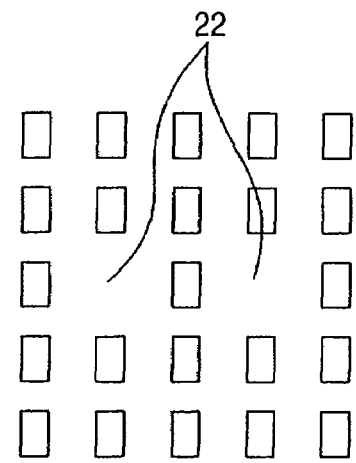
Figure 9C:
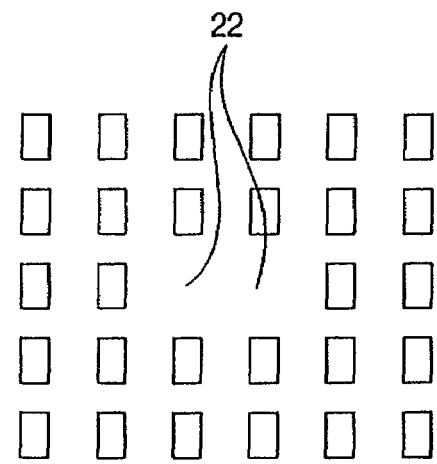

FIGS. 9A and 9B are schematic views showing the structure F. The structure F includes a defect structure F'1 and defect structures F'2 to F'9. Each of the defect structures F'2 to F'9 has no eigenmode. Table 8 shows the specific details of the structure F. Table 9 shows normalized frequencies of the resonance modes in the structure F.

TABLE 8

| Structure F | |
|---|---|
| Photonic Crystal Structure | |
| Refractive Index | 2.4 |
| In-plane Lattice Period | P |
| Out-of-plane Lattice Period | 1.4P |
| Rod Width | 0.30P |
| Rod Height | 0.25P |
| Discrete Structure Width Fx1 | 0.60P |
| Discrete Structure Width Fy1 | 0.40P |
| Discrete Structure Height Fz1 | 0.05P |
| Discrete Structure Width Fx2 | 0.40P |
| Discrete Structure Width Fy2 | 0.60P |
| Discrete Structure Height Fz2 | 0.05P |
| Point Defect Structure | |
| Defect Structure F'1 | |
| Center Coordinates (x, y, z) | (0.00P, 0.00P, 0.00P) |
| Refractive Index | 2.4 |
| Defect Structure Width F'x1 | 1.00P |
| Defect Structure Width F'y1 | 1.00P |
| Defect Structure Width F'z1 | 0.25P |
| Defect Structure F'2 | |
| Center Coordinates (x, y, z) | (−1.00P, 0.00P, 0.15P) |
| Refractive Index | 1 |
| Defect Structure Width F'x2 | 0.40P |
| Defect Structure Width F'y2 | 0.60P |
| Defect Structure Width F'z2 | 0.05P |
| Defect Structure F'3 | |
| Center Coordinates (x, y, z) | (1.00P, 0.00P, 0.15P) |

TABLE 8-continued

| Structure F | |
|---|---|
| Refractive Index | 1 |
| Defect Structure Width F'x3 | 0.40P |
| Defect Structure Width F'y3 | 0.60P |
| Defect Structure Width F'z3 | 0.05P |
| Defect Structure F'4 | |
| Center Coordinates (x, y, z) | (−1.00P, 0.00P, 0.20P) |
| Refractive Index | 1 |
| Defect Structure Width F'x4 | 0.60P |
| Defect Structure Width F'y4 | 0.40P |
| Defect Structure Width F'z4 | 0.05P |
| Defect Structure F'5 | |
| Center Coordinates (x, y, z) | (1.00P, 0.00P, 0.20P) |
| Refractive Index | 1 |
| Defect Structure Width F'x5 | 0.60P |
| Defect Structure Width F'y5 | 0.40P |
| Defect Structure Width F'z5 | 0.05P |
| Defect Structure F'6 | |
| Center Coordinates (x, y, z) | (−0.50P, 0.00P, 0.50P) |
| Refractive Index | 1 |
| Defect Structure Width F'x6 | 0.40P |
| Defect Structure Width F'y6 | 0.60P |
| Defect Structure Width F'z6 | 0.05P |
| Defect Structure F'7 | |
| Center Coordinates (x, y, z) | (0.50P, 0.00P, 0.50P) |
| Refractive Index | 1 |
| Defect Structure Width F'x7 | 0.40P |
| Defect Structure Width F'y7 | 0.60P |
| Defect Structure Width F'z7 | 0.05P |
| Defect Structure F'8 | |
| Center Coordinates (x, y, z) | (−0.50P, 0.00P, 0.55P) |
| Refractive Index | 1 |
| Defect Structure Width F'x8 | 0.60P |
| Defect Structure Width F'y8 | 0.40P |
| Defect Structure Width F'z8 | 0.05P |
| Defect Structure F'9 | |
| Center Coordinates (x, y, z) | (0.50P, 0.00P, 0.55P) |
| Refractive Index | 1 |
| Defect Structure Width F'x9 | 0.60P |
| Defect Structure Width F'y9 | 0.40P |
| Defect Structure Width F'z9 | 0.05P |

TABLE 9

| | Resonance Mode 1 |
|---|---|
| Structure F | 0.476715 |

The defect structures F'2 to F'9 are provided, so that the effective refractive index in the vicinity of the resonator can be reduced to shift the resonating frequency thereof to the high-frequency side (to shift the resonance wavelength toward the short-wavelength side). The normalized frequency in the structure B is shifted toward the high-frequency side by 0.017167. In addition, the positions at which the defect structures F'2 to F'9 are located correspond to regions at which the electric field distribution of the resonance mode 1 shows strong intensities. Therefore, the resonance wavelength can be selectively adjusted particularly for the resonance mode 1. In this embodiment, the resonance wavelength of the resonance mode 1 in the structure B is shifted toward the short-wavelength side by 7.8 nm.

As described above, when the plurality of point defects are located, the resonance wavelength can be controlled within a wider wavelength band range.

(Fourth Embodiment)

In this embodiment, a resonator structure (structure G) in which a refractive index of a medium which is a part of the point defect is adjusted will be described.

Figure 10A:
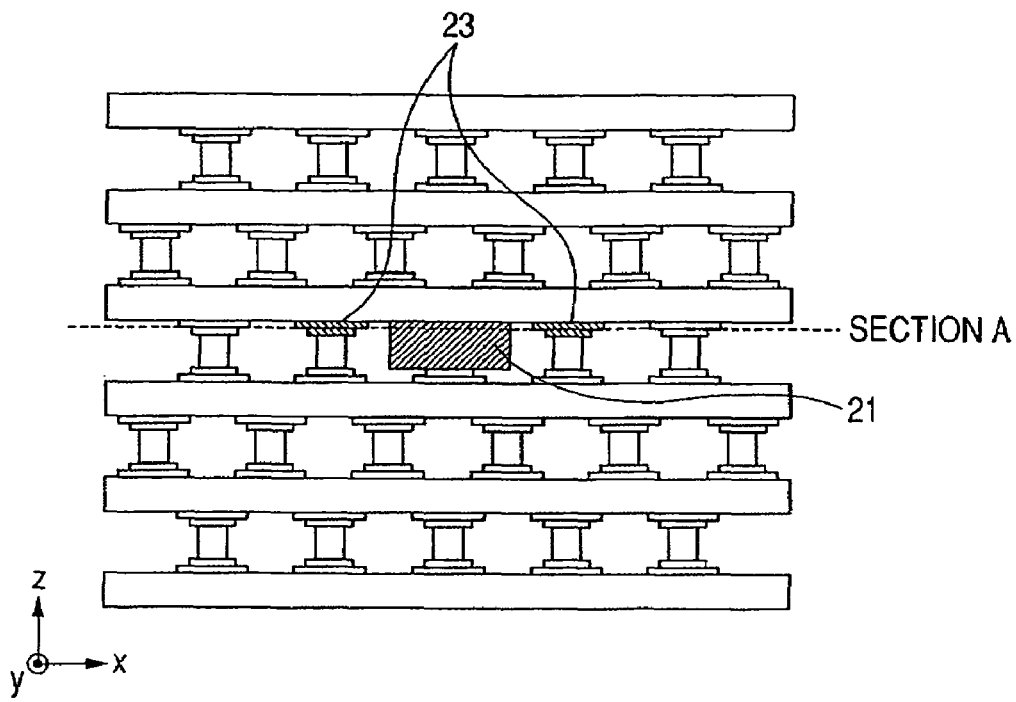
FIGS. 10A and 10B are schematic views showing a resonator structure G.
Figure 10B:
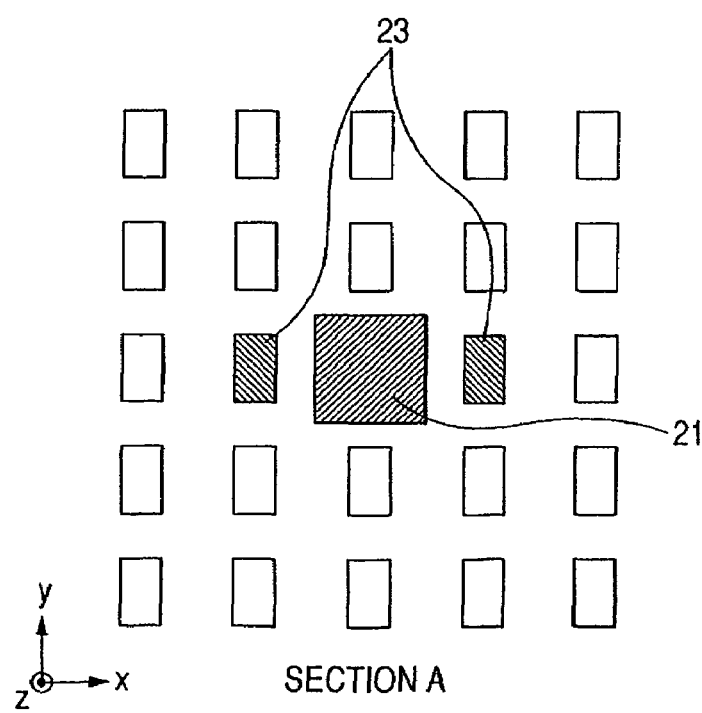

FIGS. 10A and 10B are schematic views showing the structure G. The structure G includes a defect structure G'1 and defect structures G'2 to G'5. Each of the defect structures G'2 to G'5 has no eigenmode. Table 10 shows the specific details of the structure G. A refractive index of a medium constituting the defect structures G'2 to G'5 is 1.5. This is smaller than that of a medium which is a part of a photonic crystal structure. Table 11 shows normalized frequencies of the resonance modes in the structure G.

TABLE 10

Structure G

Photonic Crystal Structure

| | |
|---|---|
| Refractive Index | 2.4 |
| In-plane Lattice Period | P |
| Out-of-plane Lattice Period | 1.4P |
| Rod Width | 0.30P |
| Rod Height | 0.25P |
| Discrete Structure Width Gx1 | 0.60P |
| Discrete Structure Width Gy1 | 0.40P |
| Discrete Structure Height Gz1 | 0.05P |
| Discrete Structure Width Gx2 | 0.40P |
| Discrete Structure Width Gy2 | 0.60P |
| Discrete Structure Height Gz2 | 0.05P |

Point Defect Structure
Defect Structure G'1

| | |
|---|---|
| Center Coordinates (x, y, z) | (0.00P, 0.00P, 0.00P) |
| Refractive Index | 2.4 |
| Defect Structure Width G'x1 | 1.00P |
| Defect Structure Width G'y1 | 1.00P |
| Defect Structure Width G'z1 | 0.35P |

Defect Structure G'2

| | |
|---|---|
| Center Coordinates (x, y, z) | (−1.00P, 0.00P, 0.15P) |
| Refractive Index | 1.5 |
| Defect Structure Width G'x2 | 0.80P |
| Defect Structure Width G'y2 | 1.00P |
| Defect Structure Width G'z2 | 0.05P |

Defect Structure G'3

| | |
|---|---|
| Center Coordinates (x, y, z) | (1.00P, 0.00P, 0.15P) |
| Refractive Index | 1.5 |
| Defect Structure Width G'x3 | 0.80P |
| Defect Structure Width G'y3 | 1.00P |
| Defect Structure Width G'z3 | 0.05P |

Defect Structure G'4

| | |
|---|---|
| Center Coordinates (x, y, z) | (−1.00P, 0.00P, 0.20P) |
| Refractive Index | 1.5 |
| Defect Structure Width G'x4 | 1.00P |
| Defect Structure Width G'y4 | 0.80P |
| Defect Structure Width G'z4 | 0.05P |

Defect Structure G'5

| | |
|---|---|
| Center Coordinates (x, y, z) | (1.00P, 0.00P, 0.20P) |
| Refractive Index | 1.5 |
| Defect Structure Width G'x5 | 1.00P |
| Defect Structure Width G'y5 | 0.80P |
| Defect Structure Width G'z5 | 0.05P |

TABLE 11

| | Resonance Mode 1 | Resonance Mode 2 | Resonance Mode 3 |
|---|---|---|---|
| Structure G | 0.459548 | 0.480016 | 0.498504 |

The defect structures G'2 to G'5 are provided, so that the effective refractive index in the vicinity of the resonator can be reduced to shift the resonating frequency thereof toward the high-frequency side (to shift the resonance wavelength toward the short-wavelength side). In addition, the positions at which the defect structures G'2 to G'5 are located correspond to regions at which the electric field distribution of the resonance mode 2 shows strong intensities. Therefore, the resonance wavelength can be selectively adjusted particularly for the resonance mode 2. A medium constituting the point defect having no eigenmode is suitably selected and used among media having high-refractive indices and low-refractive indices, an effective refractive index in the vicinity of the resonator can be set in a wide range. As a result, the resonance wavelength can be controlled within a wider band range.

(Fifth Embodiment)

An embodiment in which a single mode resonator structure is realized in a resonator including a plurality of point defects provided in a three-dimensional photonic crystal in which at least one of the point defects has no eigenmode will be described.

Table 12 shows the details of a three-dimensional photonic crystal resonator structure (structure H). Table 13 shows a resonance wavelength in the structure H.

TABLE 12

Structure H

Photonic Crystal Structure

| | |
|---|---|
| Refractive Index | 2.4 |
| In-plane Lattice Period | P = 250 nm |
| Out-of-plane Lattice Period | 1.4P |
| Rod Width | 0.30P |
| Rod Height | 0.25P |
| Discrete Structure Width Hx1 | 0.60P |
| Discrete Structure Width Hy1 | 0.40P |
| Discrete Structure Height Hz1 | 0.05P |
| Discrete Structure Width Hx2 | 0.40P |
| Discrete Structure Width Hy2 | 0.60P |
| Discrete Structure Height Hz2 | 0.05P |

Point Defect Structure
Defect Structure H'1

| | |
|---|---|
| Center Coordinates (x, y, z) | (0.00P, 0.00P, 0.00P) |
| Refractive Index | 2.4 |
| Defect Structure Width H'x1 | 0.90P |
| Defect Structure Width H'y1 | 0.90P |
| Defect Structure Width H'z1 | 0.25P |

Defect Structure H'2

| | |
|---|---|
| Center Coordinates (x, y, z) | (−1.00P, 0.00P, 0.175P) |
| Refractive Index | 1.0 (Air) |
| Defect Structure Width H'x2 | 0.60P |
| Defect Structure Width H'y2 | 0.60P |
| Defect Structure Width H'z2 | 0.10P |

Defect Structure H'3

| | |
|---|---|
| Center Coordinates (x, y, z) | (1.00P, 0.00P, 0.175P) |
| Refractive Index | 1 |
| Defect Structure Width H'x3 | 0.60P |
| Defect Structure Width H'y3 | 0.60P |
| Defect Structure Width H'z3 | 0.10P |

TABLE 13

| | Resonance Mode |
|---|---|
| Structure H | 0.486381 |

Figure 12A:
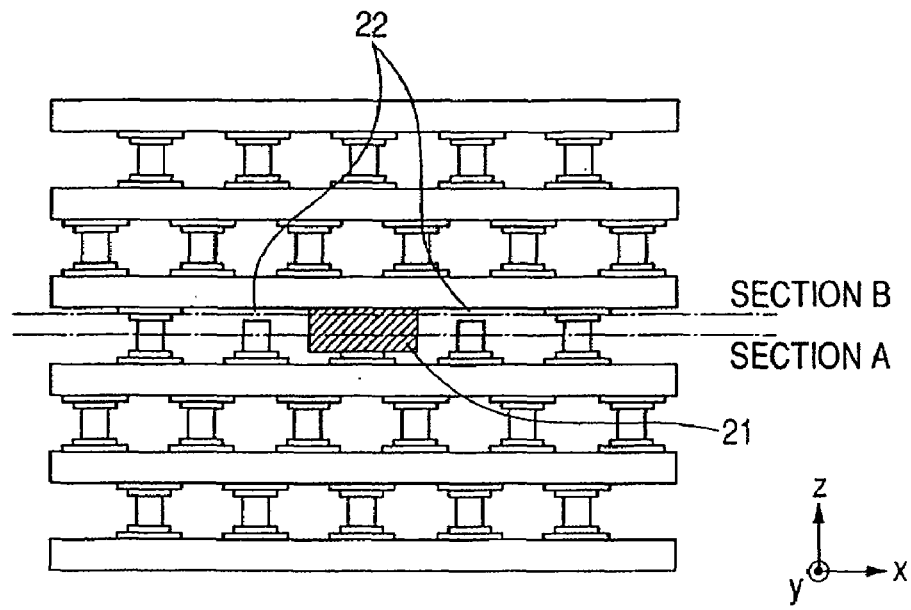
FIGS. 12A, 12B, and 12C are schematic views showing a resonator structure H.
Figure 12B:
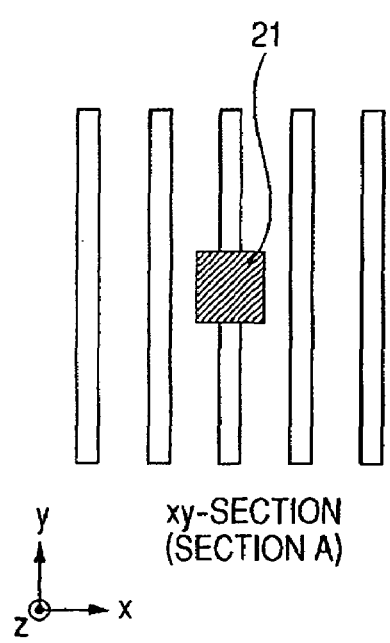
Figure 12C:
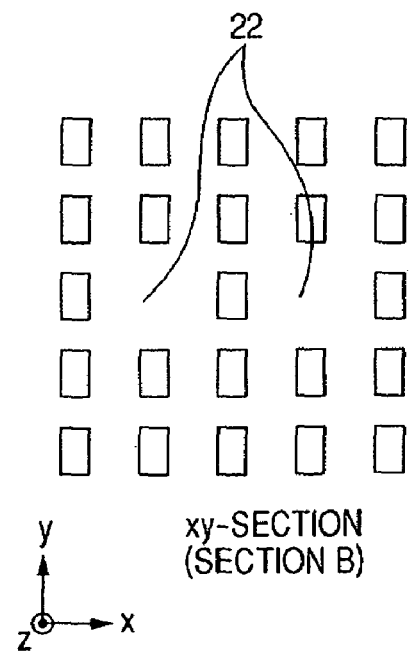

The resonator having the point defects includes a rectangular parallelepiped (defect structure H'1) made of a high-refractive index medium and gap portions (defect structure H'2 and defect structure H'3) constituted by air. FIGS. 12A and 12B show an arrangement of the periodical defect portions. A structure of each of the gap portions is identical to a gap defect structure in which a part of a discrete structure is removed.

Figure 13:
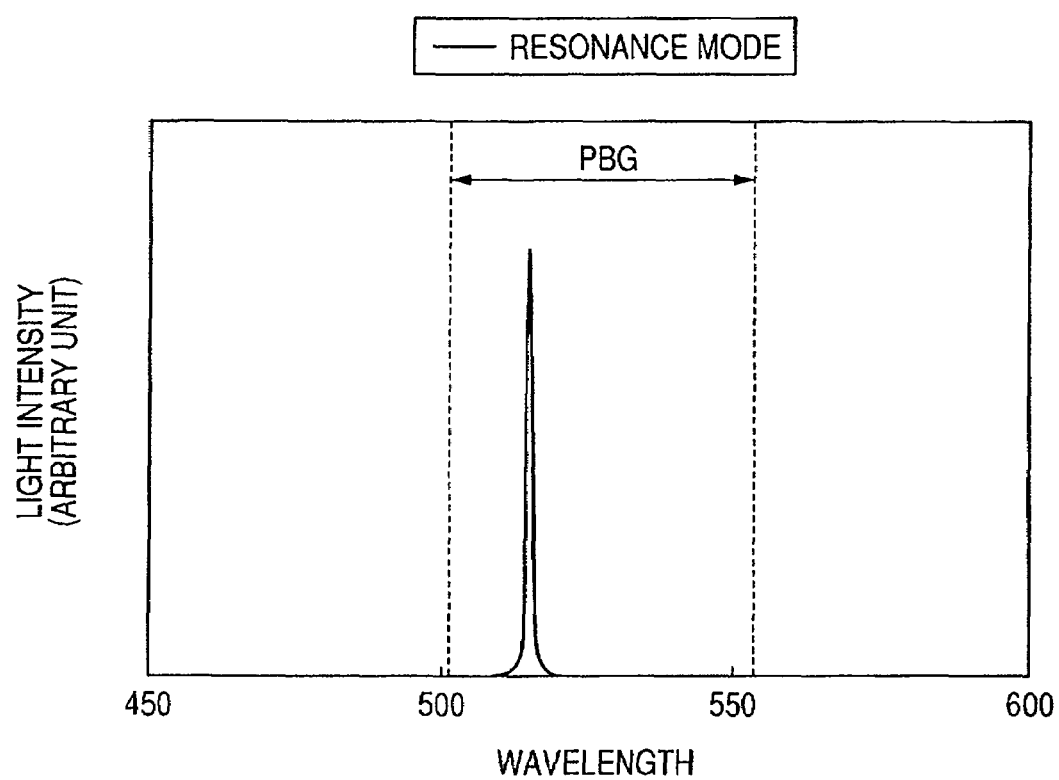
FIG. 13 is an explanatory graph showing a single resonance mode.
Figure 14A:
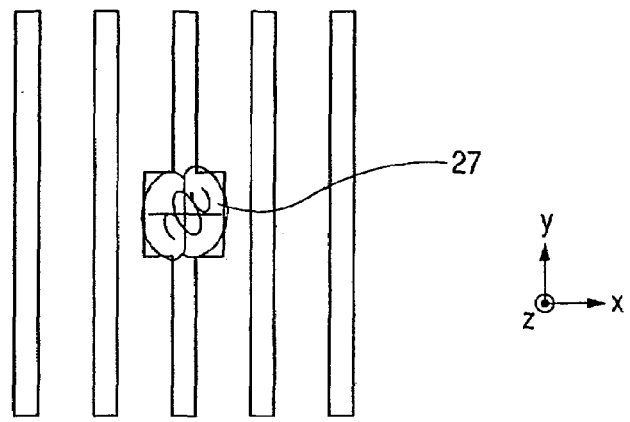
FIGS. 14A, 14B, and 14C show electric field distributions in the resonator structure H.
Figure 14B:
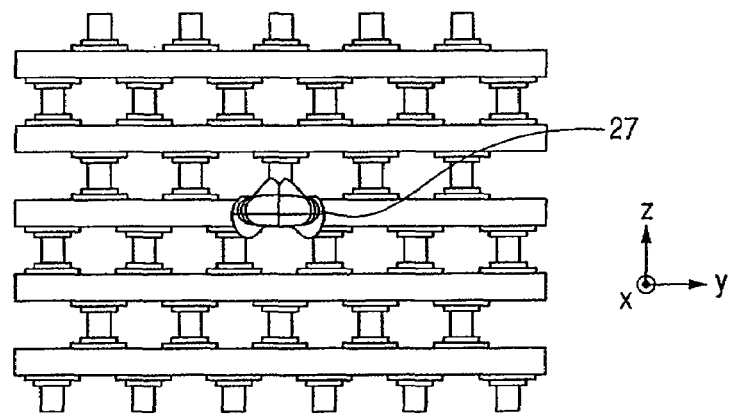
Figure 14C:
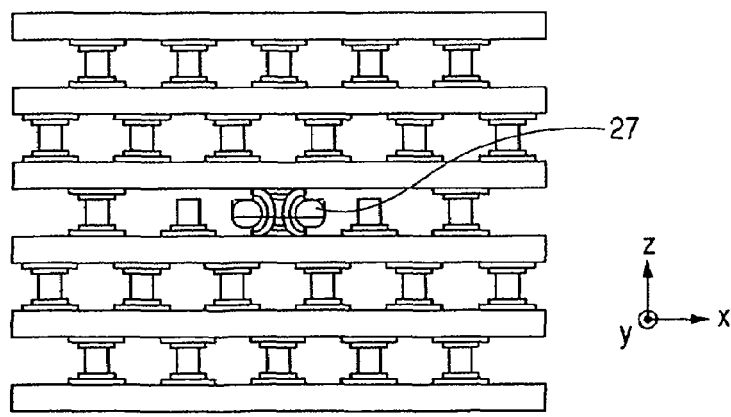

In the above-described structure, a single mode resonator in which only one resonance mode is present in the photonic band gap (PBG) can be realized. FIG. 13 shows a resonance mode spectrum at this time. Here, the center wavelength of the photonic band gap is set to 527 nm (in-plane lattice period P=250 nm). The abscissa indicates a wavelength. As shown in this spectrum, a sharp peak appears only at a resonance wavelength of 514 nm in a complete photonic band gap (503 nm to 553 nm), so that there is a resonance mode only at a single wavelength. In a structure which is the three-dimensional photonic crystal structure constituted by eight periods in x-axis and y-axis directions and four periods in z-axis direction including the defect structure H'1 at the center of the structure, a Q value indicating the resonator performance is approximately 23,800. As shown in FIGS. 14A, 14B and 14C, asymmetrical distortion does not appear in an electric field distribution (equi-strength plane) within each of the xy-section, the yz-section, and the xz-section.

As described above, when the resonator including a plurality of point defects provided in the three-dimensional photonic crystal in which at least one of the point defects has no eigenmode is used, a single mode resonator having high performance can be realized.

(Sixth Embodiment)

An example in which a resonator including a plurality of point defects provided in the three-dimensional photonic crystal in which at least one of the point defects has no eigenomode is applied to a device will be described.

An application example to a light emitting device will be described. A active medium whose light emitting spectrum includes a resonance wavelength is provided in an inner portion of the resonator and energy based on an electromagnetic wave or a current is supplied from an outside to the active medium. Therefore, it is possible to realize a light emitting device such as a laser or a LED, having very high efficiency. One of various media can be used as the active medium depending on a desirable resonance wavelength. For example, it is possible to use a compound semiconductor, an inorganic material, an organic material, a polymer material, a quantum dot, a nano-crystal, or the like. A light excitation method using an external power source, an excitation method based on current injection, or the like can be applied as an excitation method. In the case of the excitation method based on current injection, a metallic material such as Al or Cr or a transparent electro-conductive material such as ITO can be used as an electrode to cause light emission while being sandwiched. When separately operated electrodes are produced for a plurality of resonator structures, light beams emitted from the respective resonators can be separately controlled.

When the inorganic material is used as the active medium, a structure in which a active layer made of the inorganic material is sandwiched between upper and lower insulating layers and electrodes are located is provided in the inner portion of the resonator structure, thereby resonating and obtaining a light beam having a wavelength determined by a defect resonator stricture of emitted light beams. It is preferable to use a transparent material as the electrode. A metal such as Al, Au, or Cr may be used. Examples of the inorganic material which can be used include ZnS:Mn, ZnMgS:Mn, ZnS:Sm, ZnS:Tb, ZnS:Tm, CaS:Eu, SrS:Ce, SrS:Cu, $SrGa_2S_4$:Ce, and $BaAl_2S_4$:Eu. Examples of a material of the insulating layer which can be used include $SiO_2$, SiN, $Al_2O_3$, $Ta_2O_5$, and $SrTiO_3$.

The organic material may be used as the active medium. Examples of a typical low-molecular organic material which may be used include Alq, Eu(DBM)3(Phen), BeBq, or DPVBi. Examples of a typical hole transport low-molecular material which may be used include TPD, α-NPD, TPT, or Spiro-TPD. Examples of a typical electron transport low-molecular material which may be used include PBD, TAZ, OXD, or Bphen. A conductive polymer using polythiophene, polyaniline, or the like, which is doped with acid such as polystyrene sulfonate or camphorsulfonic acid may be used as a typical polymer organic material for the active layer. ITO or the like can be used for the transparent electrode. In addition to the ITO, a metal such as Al or Cr which is not transparent can be used for a rear electrode. Various materials other than the above-mentioned materials can be used.

In addition to the above-descriptions, when a current injection type light emitting structure made of various active materials is provided in the inner portion of the resonator, light having a desirable wavelength can be resonated and obtained. An active medium filling the point defect can be selected from the group including materials having multi-quantum well structure or multiquantum dot structure, such as system of InGaAsP, AlGaAs, AlGaInP, AlGaN, InGaN, ZnSe, and ZnS or organic materials depending on a desirable oscillation wavelength.

Figure 15:
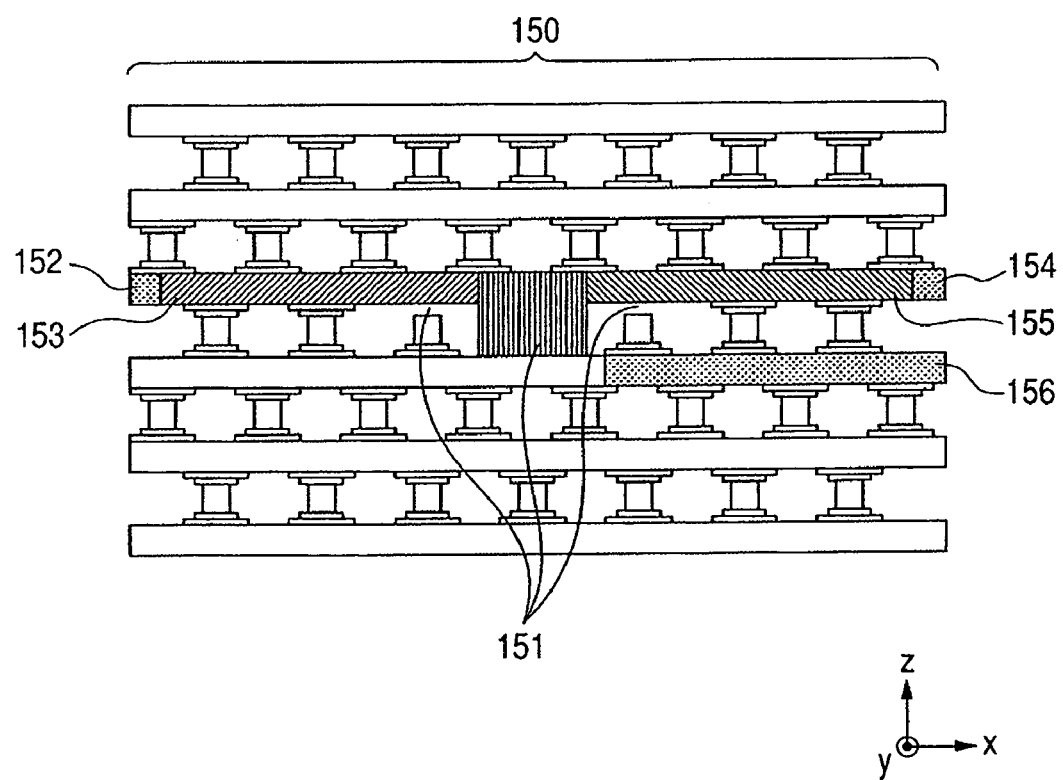
FIG. 15 is a schematic view showing a light emitting device.

FIG. 15 shows an application example in which a light emitting portion for emitting light in response to carrier injection is formed in a resonator. A light emitting device 150 is constituted by a resonator which is formed by providing point defects 151 according to the present invention in the three-dimensional photonic crystal structure, a p-type electrode 152, a p-type carrier transmission line 153, an n-type electrode 154, and an n-type carrier transmission line 155. An active portion for causing light emitting action in response to carrier injection is formed in an inner portion of the resonator. Holes are supplied to the resonator through the p-type electrode 152 and the p-type carrier transmission line 153. Electrons are supplied to the resonator through the n-type electrode 154 and the n-type carrier transmission line 155. Then, the electrons and holes are combined in the inner portion of the resonator to emit light, thereby causing laser oscillation. A wave guide 156 for leading light to an outside of the resonator is provided, so that a high-performance laser device can be realized. The wave guide 156 is a line defect wave guide formed by providing a linear defect for disturbing a period in the periodical structure portions of the three-dimensional photonic crystal. In view of the resonance mode of the resonator, when a shape or a refractive index of the linear defect portion is optimized so as to increase coupling efficiency with the resonator, a wave mode of the linear defect portion is determined. A shape or a refractive index of a columnar structure of the periodical structure portion or a novel columnar structure is provided, so that the linear defect portion can be formed. When ITO or the like is used as an electrode material for carrier injection, a structure also serving as the wave guide for leading light from a defect resonator structure of the photonic crystal is used. Therefore, a simple structure can be obtained.

When the light excitation by the external power source is to be performed, light having a wavelength out of the photonic band gap of a used photonic crystal is used. Therefore, the active medium of the photonic crystal can be efficiently excited to emit the light.

According to the above-mentioned structure, a high-performance laser device in which a control band range of the resonance wavelength is wide and the electric field distribution of the resonance mode includes no asymmetrical distortion can be realized. Such a device is suitable for a light source for display, a light source for optical communication, a THz light source, and a light source for optical pickup used for DVD or a next-generation blue light recording medium.

As described above, the resonator including the plurality of point defects provided in the three-dimensional photonic crystal in which at least one of the point defects has no eigenmode contains the active medium. Then, when the active medium is excited by exciting means, the high-performance light emitting device can be realized.

Next, a device application example to a wavelength conversion element will be described. The inner portion of the resonator according to the present invention is filled with a non-linear medium. Energy through an electromagnetic wave or a current is supplied from an outside to the non-linear medium, so that light having strong energy can be confined in a very narrow region. Therefore, it is possible to obtain a wavelength conversion element having a very strong non-linear optical effect. Examples of the non-linear medium which can be used include $LiNbO_3$, $LiTaO_3$, $BaTiO_3$, $ZnO$, $BaB_2O_4$, $BiB_3O_6$, and $KTiOPO_4$.

Figure 16:
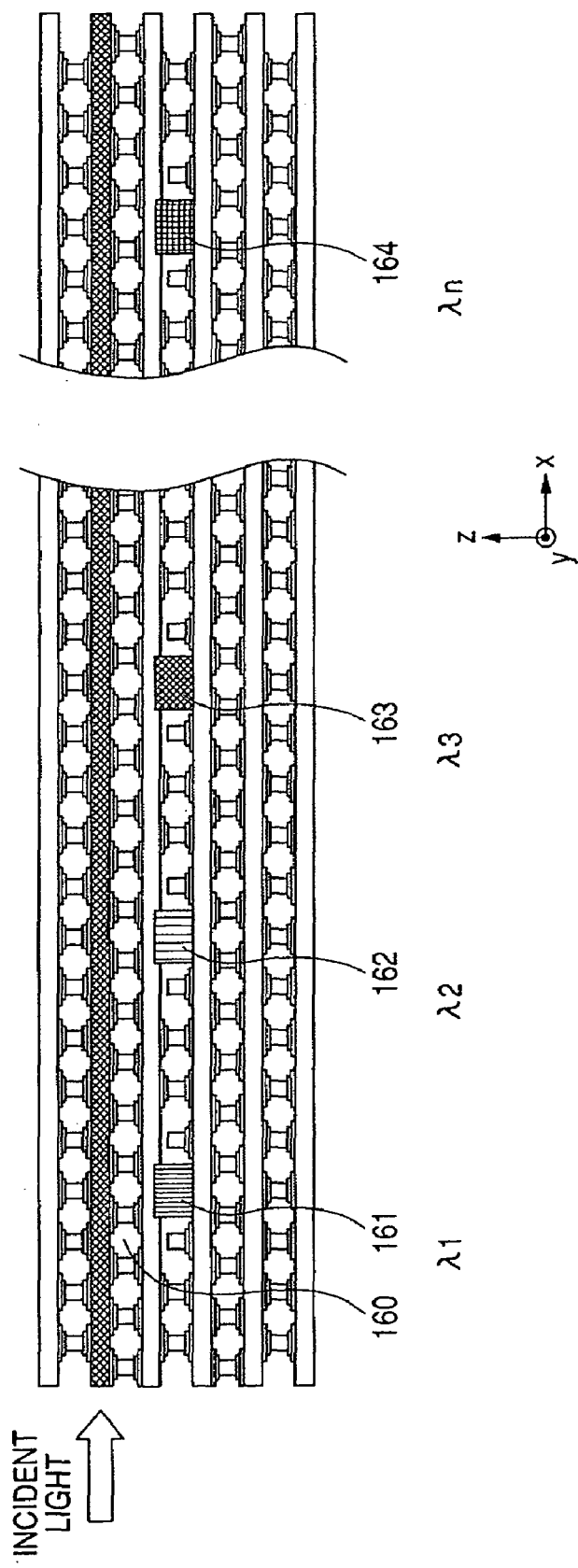
FIG. 16 is a schematic view showing an optical multiplexing and branching element.
Figure 17:
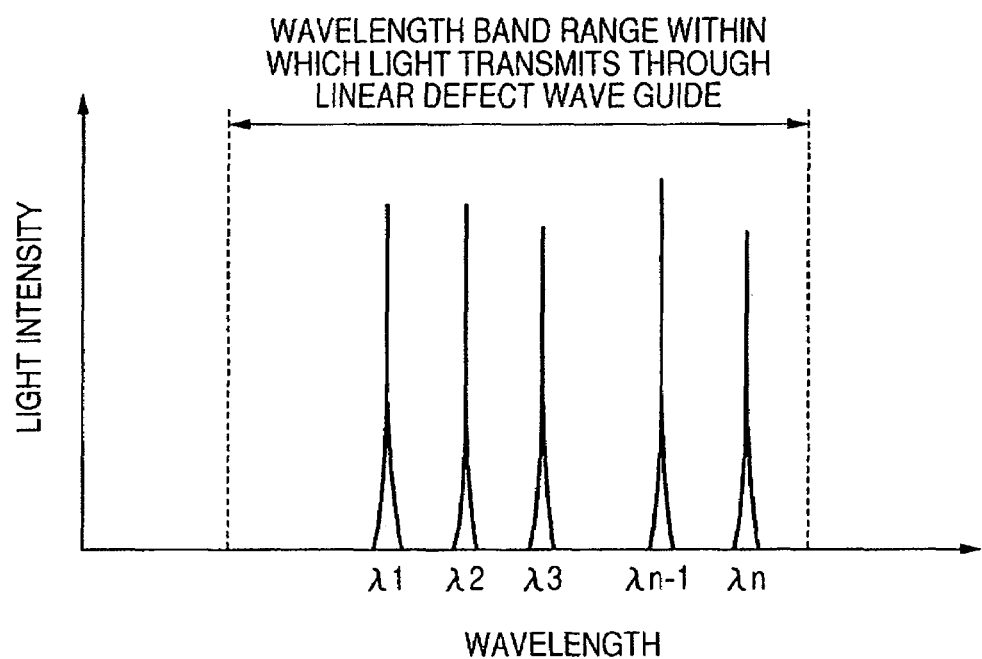
FIG. 17 is an explanatory graph showing the optical multiplexing and branching element.
Figure 18A:
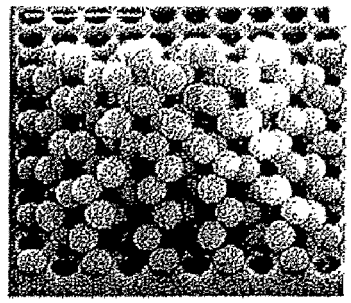
FIGS. 18A, 18B, 18C, 18D, 18E, and 18F show conventional three-dimensional photonic crystal structures.
Figure 18B:
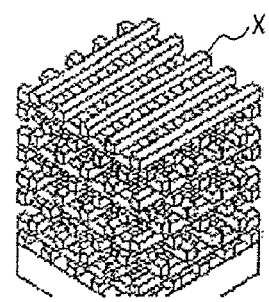
Figure 18C:
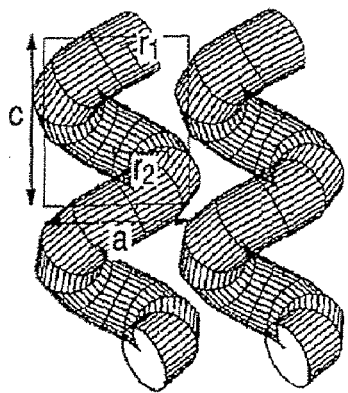
Figure 18D:
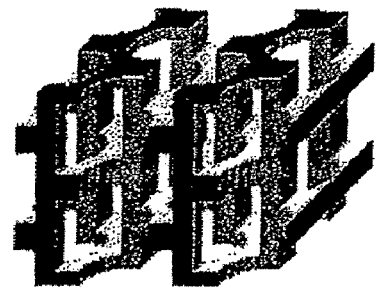
Figure 18E:
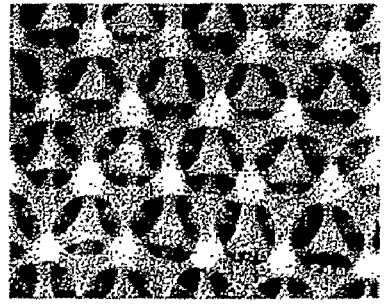
Figure 18F:
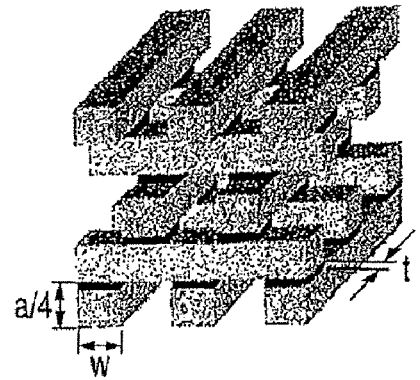

FIG. 16 shows a device application example to an optical multiplexing and branching element in which the linear defect wave guide and the resonator according to the present invention are combined. A linear defect wave guide 160 including a linear defect and resonator structures 161 to 164 in the vicinity thereof are provided in the three-dimensional photonic crystal structure. The resonator structures 161 to 164 are designed so as to operate at different resonance wavelengths. Each of the resonator structures can guide only desirable light traveling through the wave guide to the resonator. The resonance wavelengths are controlled based on the number of point defects which are parts of the resonator, a shape of the point defect, and a refractive index thereof. The resonator structures 161 to 164 are separately located so as not to affect the resonance mode, thereby making it possible to realize a high-performance optical multiplexing and branching circuit without crosstalk. Such an optical device is useful for an optical multiplexing and branching element used in, in particular, an optical communication band range. FIG. 17 shows an element structural example and a spectrum at this time. It is assumed that the resonance wavelengths of the resonators located in respective regions are $\lambda 1$, $\lambda 2$, $\lambda 3$, and $\lambda n$. A state in which light having a plurality of resonance wavelengths is incident on the linear defect wave guide is shown in a graph. There are the resonance wavelengths of the respective resonators in the wavelength band range in which light travels through the linear defect wave guide, so that optical multiplexing and branching can be realized at n wavelengths. When the resonator based on the three-dimensional photonic crystal structure according to the present invention is used, it is possible to provide a high-performance optical multiplexing and branching element capable of controlling the resonance wavelength in a wide wavelength band range.

As described above, the resonator in which a control range of the resonance wavelength is a wide band range and a desirable electric field distribution is obtained according to the present invention can be applied to the light emitting device such as an LED or a laser, the wave conversion element, the optical multiplexing and branching element, and the like.

This application claims priority from Japanese Patent Application Nos. 2005-166753 filed Jun. 7, 2005 and 2006-144355 filed May 24, 2006, which are hereby incorporated by reference herein.

What is claimed is:

1. A resonator, comprising:
a three-dimensional photonic crystal including a plurality of point defects,
wherein the three-dimensional photonic crystal includes:
a first layer in which a plurality of columnar structures are arranged at a predetermined interval;
a second layer in which a plurality of columnar structures extended in a direction different from a direction in which the columnar structure of the first layer extends at predetermined intervals;
a third layer in which a plurality of columnar structures extended in a direction aligned with the direction in which the columnar structure of the first layer extends at predetermined intervals;
a fourth layer in which a plurality of columnar structures extended in a direction aligned with a direction in which the columnar structure of the second layer extends at predetermined intervals; and
at least one additional layer including discrete structures discretely arranged in a plane parallel to each of the first layer, the second layer, the third layer, and the fourth layer,
wherein the first layer, the second layer, the third layer, and the forth layer are successively stacked with the additional layer interposed therebetween,
wherein the columnar structures included in the first layer and the third layer are stacked to shift the columnar structures by half the predetermined interval in a direction perpendicular to the direction in which the columnar structures are extended,
wherein the columnar structures included in the second layer and the fourth layer are stacked to shift the columnar structures by half the predetermined interval in a direction perpendicular to the direction in which the columnar structures are extended,
wherein each of the discrete structures included in the additional layer is a three-dimensional photonic crystal arranged at a position corresponding to intersections of the columnar structures, and
wherein at least one of the plurality of point defects has no eigenmode in a photonic band gap of the three-dimensional photonic crystal.

2. A resonator according to claim 1, wherein the point defects having no eigenmode is arranged in the additional layer including the discrete structures.

3. A resonator according to claim 1, wherein the point defects having no eigenmode includes an area in the plane parallel to each of the first layer, second layer, the third layer, and the fourth layer which is larger than an area of the discrete structures.

4. A resonator according to claim 1, wherein a refractive index of a medium constituting the at least one of the plurality of point defects is different from a refractive index of a medium of one of the columnar structure and the discrete structure.

5. A resonator according to claim 1, wherein a medium constituting the at least one of the plurality of point defects is the same as a medium constituting a structure other than a columnar structure and a discrete structure.

6. A resonator according to claim 1,
wherein the plurality of point defects comprise a point defect having a eigenmode and the point defect having no eigenmode, and
wherein the point defect having no eigenmode is arranged in a peak position of an electric field distribution of the eigenmode.

7. A resonator according to claim 1, wherein the resonator operates in a single mode.

8. An optical multiplexing and branching element, comprising:
the resonator according to claim 1; and
a linear defect wave guide.

9. A wavelength conversion element, comprising
the resonator according to claim 1,
wherein each of the point defects of the resonator includes a non-linear medium.

10. A light emitting device, comprising:
the resonator according to claim 1 in which each of the point defects includes a active medium; and
exciting means for exciting the light emitting medium.

11. A light emitting device according to claim 10, wherein the light emitting device causes laser oscillation.

* * * * *